United States Patent
Woo et al.

(10) Patent No.: US 11,762,787 B2
(45) Date of Patent: Sep. 19, 2023

(54) QUAD-CHANNEL DRAM

(71) Applicant: Rambus Inc., San Jose, CA (US)

(72) Inventors: Steven C. Woo, Saratoga, CA (US); Torsten Partsch, San Jose, CA (US)

(73) Assignee: Rambus Inc., San Jose, CA (US)

( * ) Notice: Subject to any disclaimer, the term of this patent is extended or adjusted under 35 U.S.C. 154(b) by 211 days.

(21) Appl. No.: 17/433,071

(22) PCT Filed: Feb. 18, 2020

(86) PCT No.: PCT/US2020/018634
§ 371 (c)(1),
(2) Date: Aug. 23, 2021

(87) PCT Pub. No.: WO2020/176291
PCT Pub. Date: Sep. 3, 2020

(65) Prior Publication Data
US 2022/0156204 A1     May 19, 2022

Related U.S. Application Data

(60) Provisional application No. 62/811,903, filed on Feb. 28, 2019.

(51) Int. Cl.
*G06F 13/16* (2006.01)
(52) U.S. Cl.
CPC ............... *G06F 13/1668* (2013.01)
(58) Field of Classification Search
None
See application file for complete search history.

(56) References Cited

U.S. PATENT DOCUMENTS

| | | |
|---|---|---|
| 6,785,782 B1 | 8/2004 | Ware et al. |
| 7,200,710 B2 | 4/2007 | Perego et al. |
| 7,679,984 B2 | 3/2010 | Kao |
| 8,069,379 B2 | 11/2011 | Perego et al. |
| 8,275,936 B1 | 9/2012 | Haywood et al. |
| 8,332,680 B2 | 12/2012 | Best |

(Continued)

FOREIGN PATENT DOCUMENTS

WO     WO-2018-204086 A1    11/2018

OTHER PUBLICATIONS

EP Extended European Search Report dated Apr. 13, 2022 re: EP Appln. No. 20763110.2. 8 pages.

(Continued)

*Primary Examiner* — Michael Sun
(74) *Attorney, Agent, or Firm* — The Neudeck Law Firm, LLC

(57) ABSTRACT

A DRAM includes at least four groups of memory cores and at least four memory access channel interfaces that, in a first mode, each respectively are to receive memory access commands, directed to a corresponding one of the groups of memory cores. One-half of the memory access channel interfaces are to, in a second mode, each respectively receive memory access commands, directed to a corresponding two of four of the groups of memory cores. The memory access channel interfaces to have electrical connection conductors that lie on opposing sides of at least one line of reflectional symmetry from a second one-half of the one-half of the at least four memory access channel interfaces.

20 Claims, 22 Drawing Sheets

(56) References Cited

U.S. PATENT DOCUMENTS

| | | |
|---|---|---|
| 8,438,515 B2 | 5/2013 | Leddige et al. |
| 8,595,459 B2 | 11/2013 | Ware et al. |
| 8,683,149 B2 | 3/2014 | Ware et al. |
| 9,009,362 B2 | 4/2015 | Bains |
| 9,111,645 B2 | 8/2015 | Kasamsetty et al. |
| 9,117,496 B2 | 8/2015 | Shaeffer et al. |
| 9,165,639 B2 | 10/2015 | Ware et al. |
| 9,232,651 B2 | 1/2016 | Ware et al. |
| 9,837,132 B2* | 12/2017 | Ware .................. G11C 29/025 |
| 11,068,161 B1* | 7/2021 | Chen .................. G06F 13/105 |
| 2007/0192563 A1 | 8/2007 | Rajan et al. |
| 2009/0119443 A1 | 5/2009 | Tremaine |
| 2013/0194854 A1* | 8/2013 | Shaeffer .................. G11C 5/06 365/63 |
| 2013/0346684 A1 | 12/2013 | Bains |
| 2016/0314085 A1 | 10/2016 | Ware et al. |
| 2017/0093400 A1* | 3/2017 | Bains .................. G06F 3/0673 |
| 2017/0337144 A1 | 11/2017 | Ware et al. |
| 2017/0371812 A1* | 12/2017 | Chun .................. G06F 3/0613 |
| 2018/0024739 A1 | 1/2018 | Schmisseur |
| 2018/0137067 A1 | 5/2018 | Ware et al. |
| 2018/0189219 A1 | 7/2018 | Kim |
| 2018/0285013 A1 | 10/2018 | Rajan et al. |

OTHER PUBLICATIONS

Notification of Transmittal of the International Search Report and the Written Opinion of the International Searching Authority, or the Declaration dated Jun. 12, 2020 re: Int'l Appln. No. PCT/US2020/018634. 15 pages.

EP Response filed on Nov. 9, 2022 in Response to the Extended European Search Report dated Apr. 13, 2022 and the Official Communication Pursuant to Rules 70(2) and 70a(2) EPC dated May 4, 2022 re: EP Appln. No. 20763110.2. 24 pages.

* cited by examiner

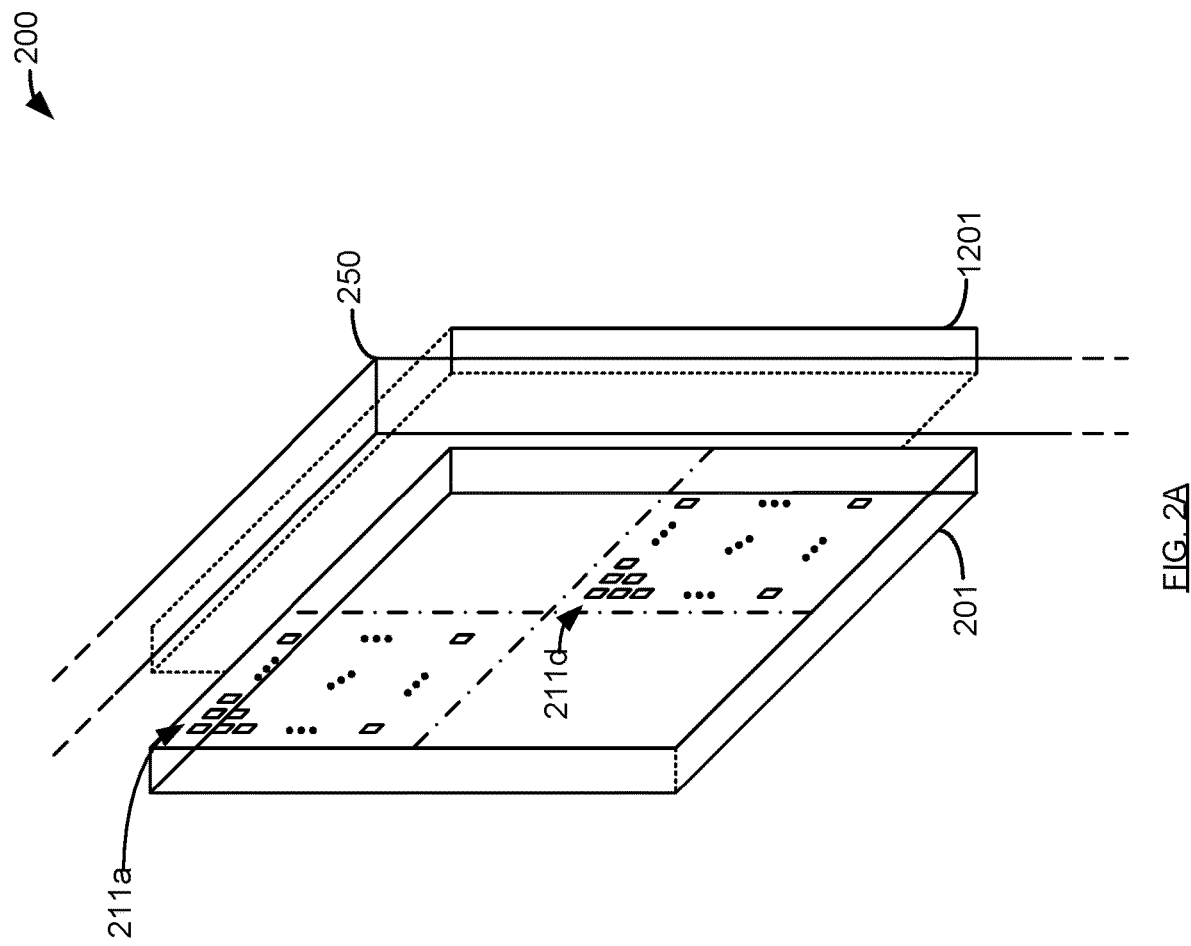

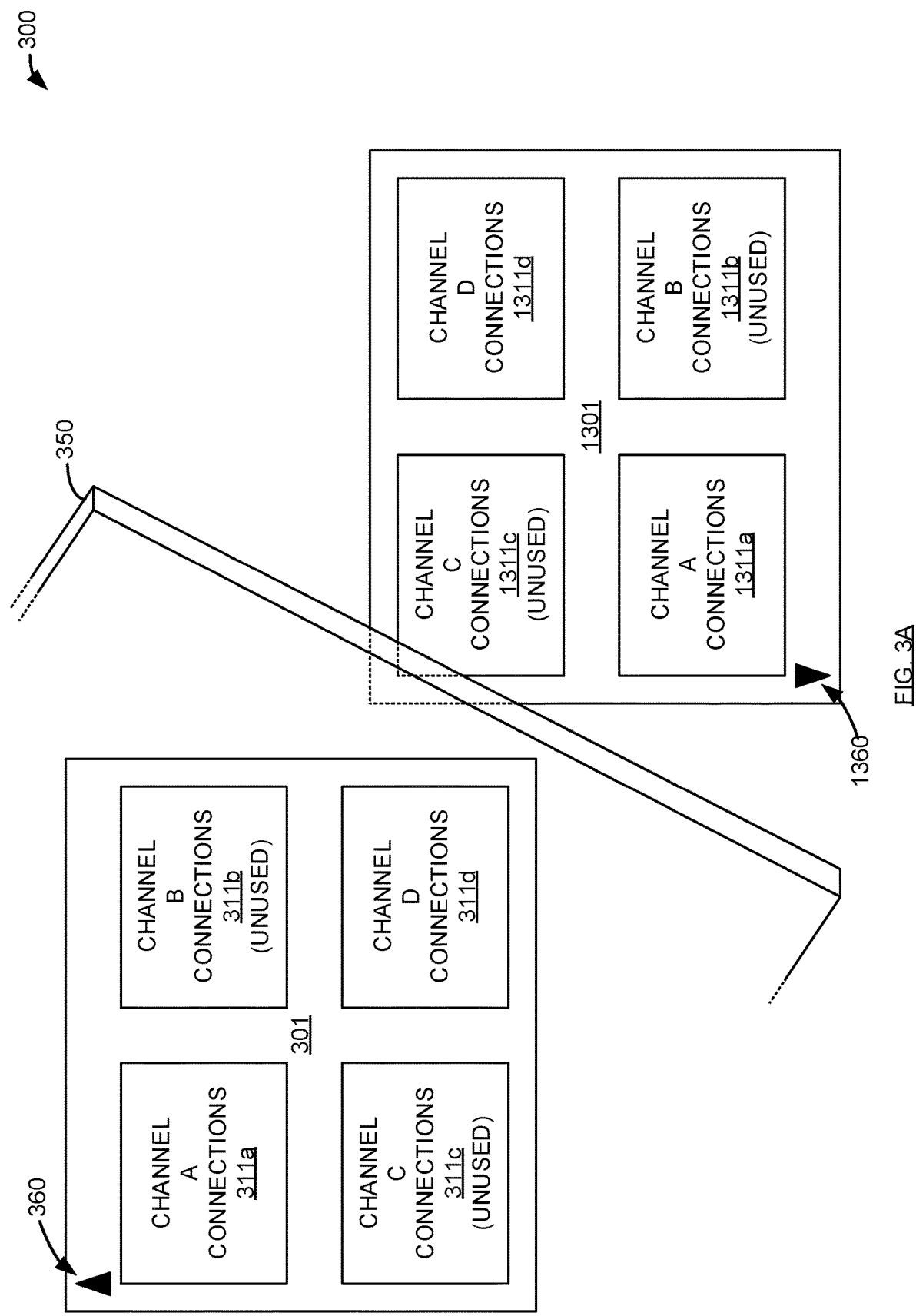

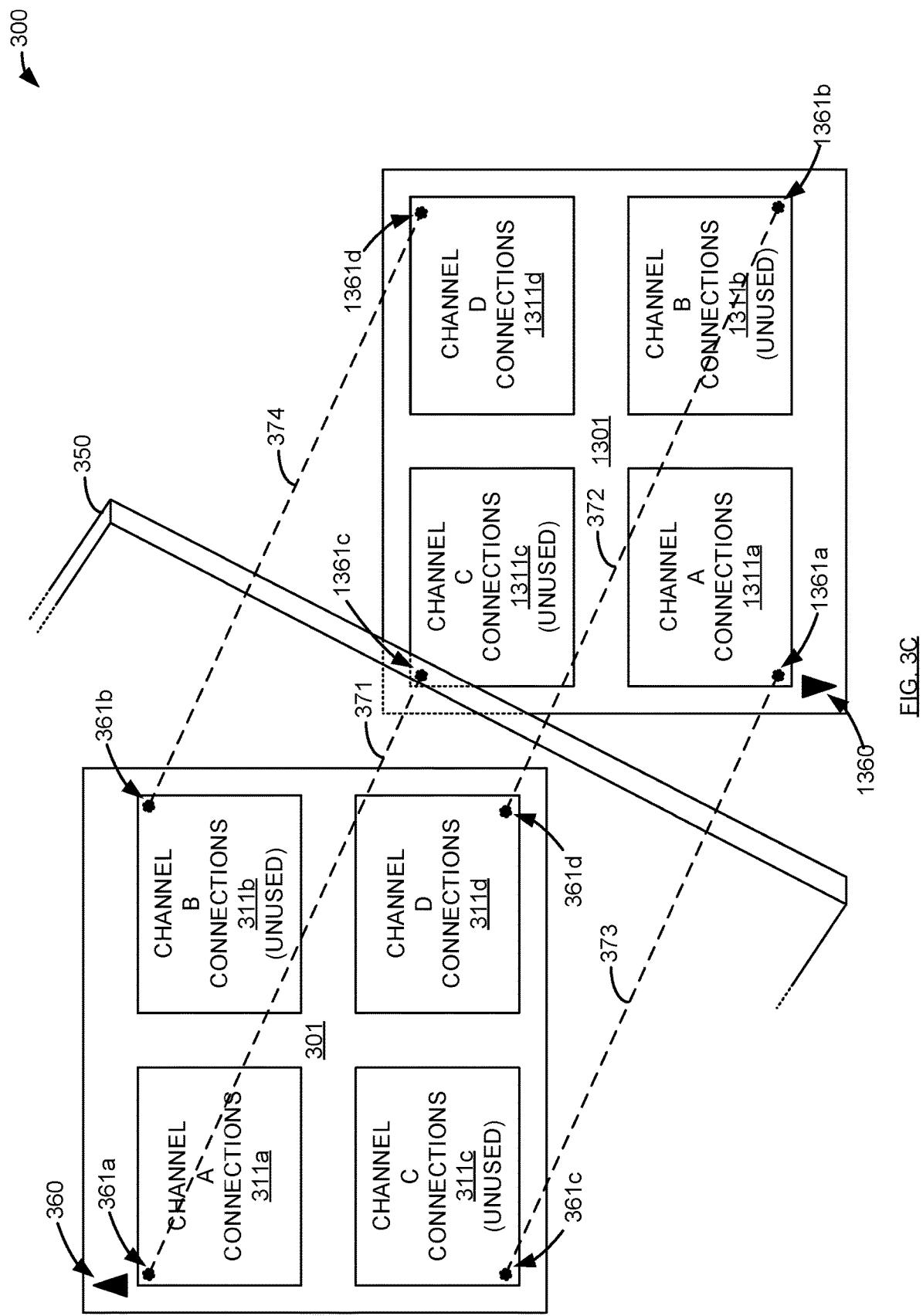

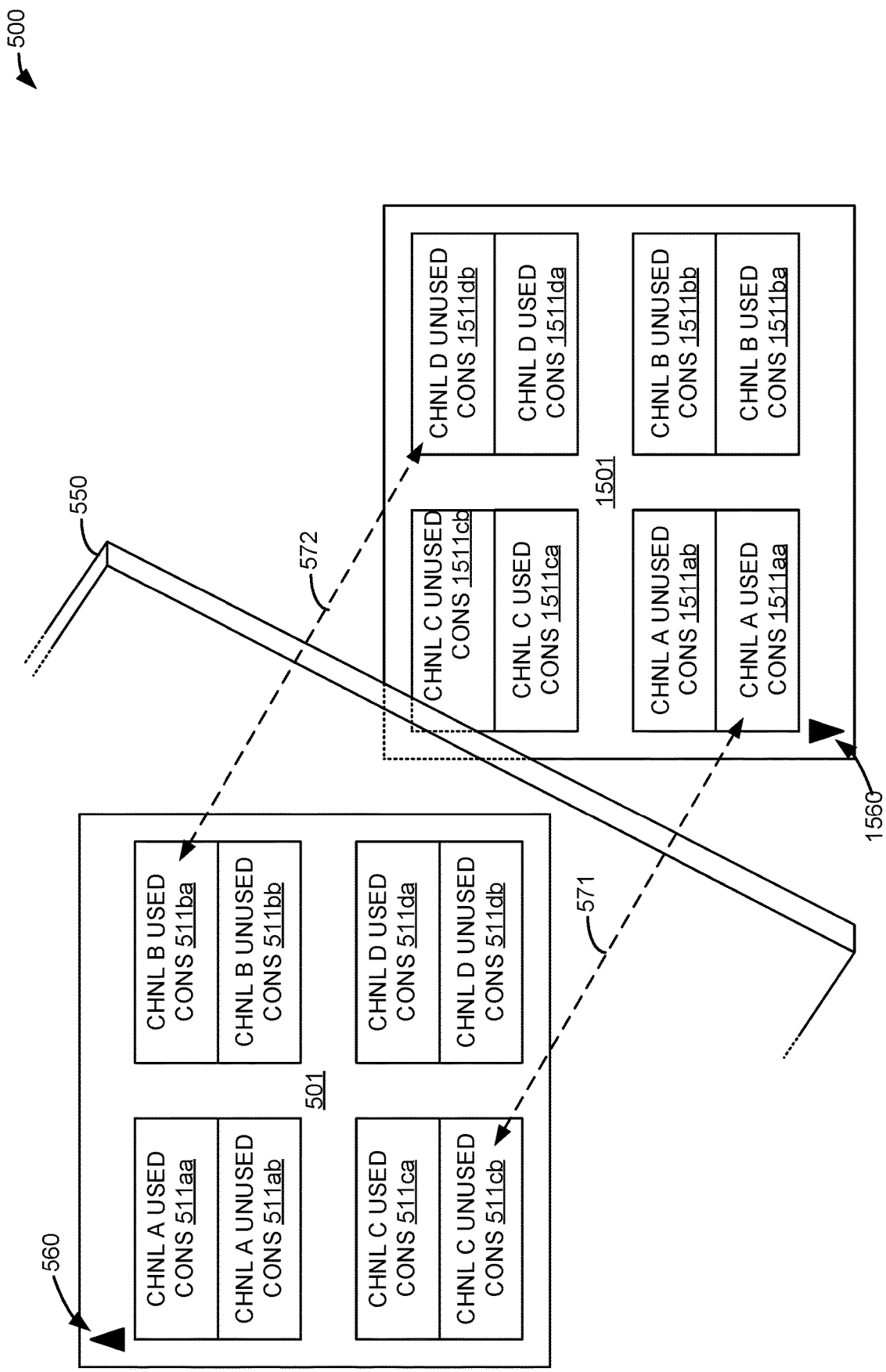

QUAD-CHANNEL DRAM

BRIEF DESCRIPTION OF THE DRAWINGS

FIG. 2A illustrates a first and second quad-channel DRAMs oppositely mounted to utilize dual-channel mode.

FIG. 3A illustrates a first example device orientation and active channel connections for a pair of oppositely mounted quad-channel DRAMs.

FIG. 3C illustrates a first example active to inactive channel connection correspondence for a pair of oppositely mounted quad-channel DRAMs.

FIG. 5B illustrates a first example active to inactive partial per-channel connection correspondence for a pair of oppositely mounted quad-channel DRAMs.

DETAILED DESCRIPTION OF THE EMBODIMENTS

In an embodiment, a dynamic random access memory (DRAM) device may have four channels (i.e., a quad-channel device.) In a first mode (i.e., quad-channel mode), these channels may all be operated independently of each other and each access (i.e., read and write) different internal memory cores. In another mode, two of the four channels may be inactivated (i.e., dual-channel mode.) The remaining active channels respectively access the internal memory cores that otherwise would have been accessed by the inactivated channels. In an embodiment, the data width of the active channels is the same as the data width used in the quad-channel mode. The arrangement of the DRAM package balls is such that when two DRAM devices being operated in dual-channel mode, and are aligned on opposite sides of a substrate, they appear, to a memory controller, electrically and logically as a single quad-channel device being operated in four-channel mode. This type of arrangement allows each of the command/address (C/A) and data (DQ) buses, to be routed point-to-point. Since all of the signal routing is point-to-point, branches to reach multiple devices on the same signal line are not required.

Mounting two DRAM devices that are aligned on opposite sides of a substrate, and operating them as a single channel having twice the memory capacity can be referred to as clamshell mode. At high data rates, this type of arrangement requires short signal branches (a.k.a., stubs) off of the main signal traces of the command/address (C/A) bus in order to reach the two devices (rather than no stubs required to reach only one device.) Because these branches are relatively short (e.g., the thickness of the substrate) it is an efficient way of doubling the capacity of a memory channel without excessively loading the C/A signals while also keeping the data bus signals (DQs) point-to-point.

Figure 1A:
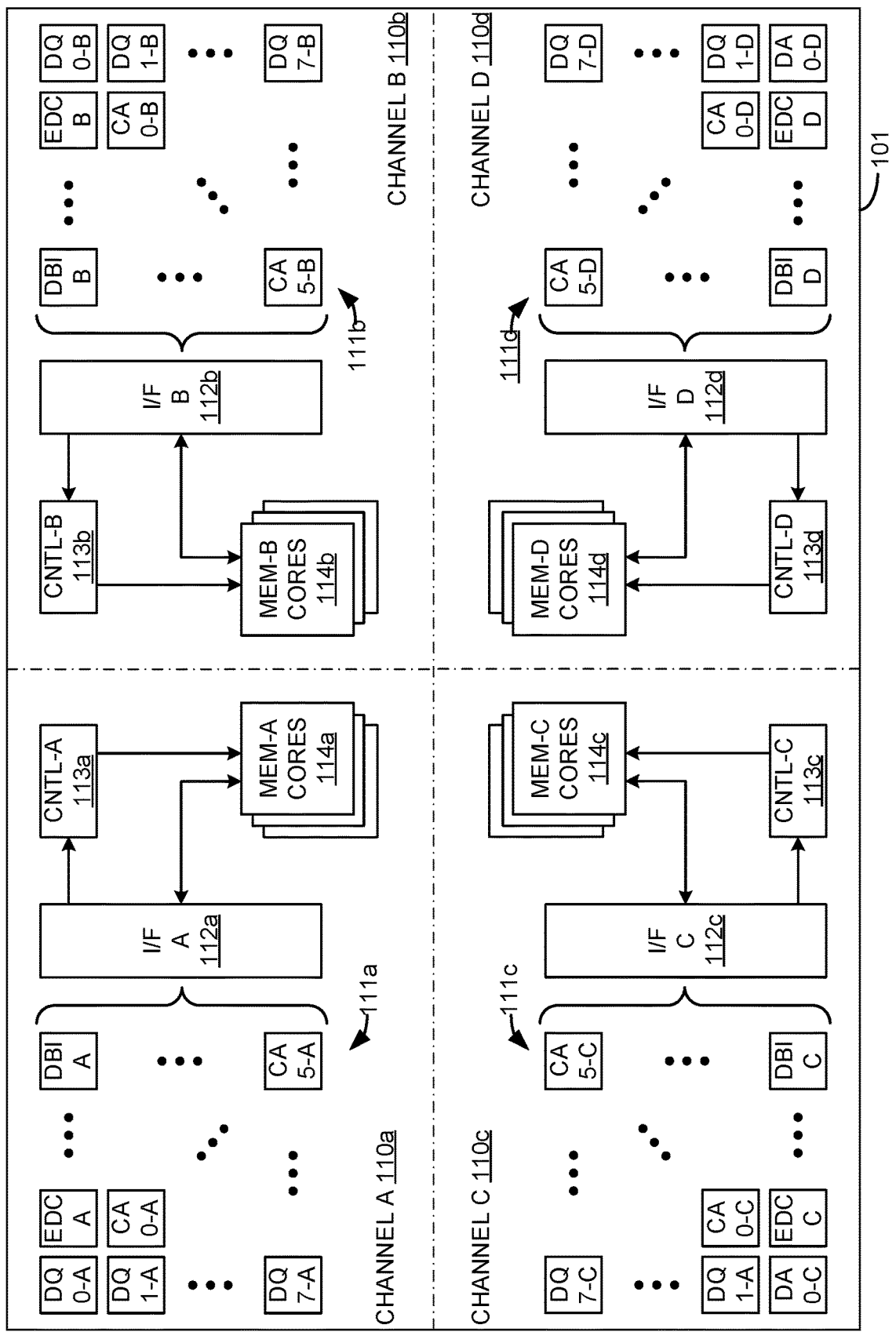
FIG. 1A is a block diagram illustrating a first mode of a quad-channel DRAM.

FIG. 1A is a block diagram illustrating a first mode of a quad-channel DRAM. In FIG. 1A, DRAM device 101 is configured with four active channels: channel A 110*a*, channel B 110*b*, channel C 110*c*, and channel d 110*d*. The active circuitry/logic for channel A 110*a* when DRAM device 101 is configured in the four active channel (a.k.a., quad-channel) mode comprises a set of memory cores 114*a* that are accessed via channel A, channel A control circuitry 113*a*, channel A interface (I/F) circuitry 112*a*, and channel A electrical connection points 111*a*. The active circuitry/logic for channel B 110*b* when DRAM device 101 is configured in quad-channel mode comprises a set of memory cores 114*b* that are accessed via channel B, channel B control circuitry 113*b*, channel B interface (I/F) circuitry 112*b*, and channel B electrical connection points 111*b*. The active circuitry/logic for channel C 110*c* when DRAM device 101 is configured in quad-channel mode comprises a set of memory cores 114*c* that are accessed via channel C, channel C control circuitry 113*c*, channel C interface (I/F) circuitry 112*c*, and channel C electrical connection points 111*c*. The active circuitry/logic for channel D 110*d* when DRAM device 101 is configured in quad-channel mode comprises a set of memory cores 114*d* that are accessed via channel D, channel D control circuitry 113*d*, channel D interface (I/F) circuitry 112*d*, and channel D electrical connection points 111*d*.

Channel A electrical connection points 111*a* are operatively coupled to interface circuitry 112*a*. Interface circuitry 112*a* is operatively coupled to control circuitry 113*a* and memory cores 114*a*. Control circuitry 113*a* is operatively coupled to interface 112*a*. Control circuitry 113*a* receives commands and addressed from interface circuitry 112*a*. These commands include commands to access (i.e., read, write, activate, precharge, etc.) one or more of memory cores 114*a*. In the case of a write command, data received at interface 112*a* via electrical connection points 111*a* is coupled to one or more of memory cores 114a to be stored. In the case of a read command, the addressed one or more of memory cores 114a couples retrieved data to interface 112a to be transmitted via electrical connection points 111a.

Channel B electrical connection points 111b are operatively coupled to interface circuitry 112b. Interface circuitry 112b is operatively coupled to control circuitry 113b and memory cores 114b. Control circuitry 113b is operatively coupled to interface 112b. Control circuitry 113b receives commands and addressed from interface circuitry 112b. These commands include commands to access one or more of memory cores 114b. In the case of a write command, data received at interface 112b via electrical connection points 111b is coupled to one or more of memory cores 114b to be stored. In the case of a read command, the addressed one or more of memory cores 114b couples retrieved data to interface 112b to be transmitted via electrical connection points 111b.

Channel C electrical connection points 111c are operatively coupled to interface circuitry 112c. Interface circuitry 112c is operatively coupled to control circuitry 113c and memory cores 114c. Control circuitry 113c is operatively coupled to interface 112c. Control circuitry 113c receives commands and addressed from interface circuitry 112c. These commands include commands to access one or more of memory cores 114c. In the case of a write command, data received at interface 112c via electrical connection points 111c is coupled to one or more of memory cores 114c to be stored. In the case of a read command, the addressed one or more of memory cores 114c couples retrieved data to interface 112c to be transmitted via electrical connection points 111c.

Channel D electrical connection points 111d are operatively coupled to interface circuitry 112d. Interface circuitry 112d is operatively coupled to control circuitry 113d and memory cores 114d. Control circuitry 113d is operatively coupled to interface 112d. Control circuitry 113d receives commands and addressed from interface circuitry 112d. These commands include commands to access one or more of memory cores 114d. In the case of a write command, data received at interface 112d via electrical connection points 111d is coupled to one or more of memory cores 114d to be stored. In the case of a read command, the addressed one or more of memory cores 114d couples retrieved data to interface 112d to be transmitted via electrical connection points 111d.

Channel A-D electrical connection points 111a-111d may correspond to pads, package pins, solder balls, or other means of electrically connecting a DRAM integrated circuit to a substrate, such as a printed circuit board. Memory cores 114a-114d may comprise dynamic random access memory (DRAM) array or other type of memory arrays, for example, static random access memory (SRAM) array, or non-volatile memory arrays such as flash.

It should be understood from the foregoing that, in quad-channel mode, each of channels A-D 110a-110d comprise enough active circuitry and electrical connection points 111a-111d to each operate independently of each other channel A-D 110a-110d. Each of channels A-D 110a-110d in quad-channel mode operate the command, address, and data transfer functions of their respective channel A-D 110a-110d independently of the other channels A-D 110a-110d.

In an embodiment, each of channels A-D 110a-110d includes nine (9) bidirectional data (DQ) lines (eight data lines and one for error-detection, correction, and/or parity.) In another embodiment, each of channels A-D 110a-110d includes eight (8) bidirectional data (DQ) lines. Each of channels A-D 110a-110d includes a C/A bus. Each of the channel A-D 110a-110d C/A busses include separate and independent, from the other C/A busses, data bus inversion (DBI), error detection (EDC), and timing signals (e.g., write strobes).

In an embodiment, each channel A-D 110a-110d may each receive one or more independent clocking signal(s) (not shown in FIGS. 1A-1B) that drive the operations of that respective channel A-D 110a-110d. In another embodiment, channels A-D 110a-110d may all share the one or more clock signal(s). Even though channels A-D 110a-110d function independently, their operations are driven by, and aligned to, the common clocking signal(s). In another embodiment, two channels A-D 110a-110d may share common clocking signal(s). For example, channel A 110a and channel B 110b may share a clocking signal while channel C 110c and channel D 110d share another clocking signal.

Figure 1B:
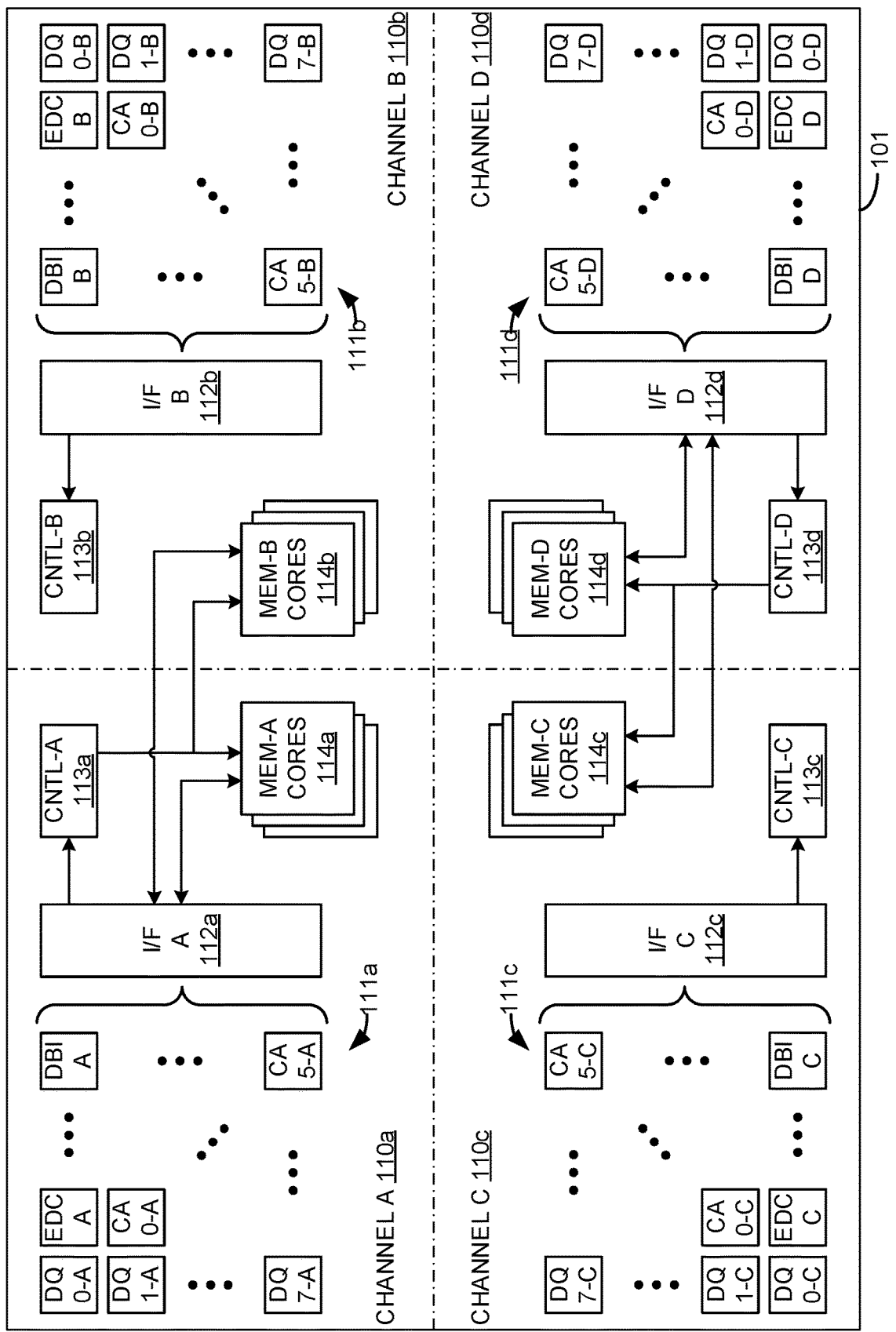
FIG. 1B is a block diagram illustrating a second mode of a quad-channel DRAM.

FIG. 1B is a block diagram illustrating a second mode of a quad-channel DRAM. In FIG. 1B, DRAM device 101 is configured with two active channels: channel A 110a, and channel D 110d. Thus, in this dual-channel mode, channel B electrical connection points 111b, channel B interface circuitry 112b, and channel B control circuitry 113b are inactivated, unused, and/or powered off. Likewise, in this dual-channel mode, channel C electrical connection points 111c, channel C interface circuitry 112c, and channel B control circuitry 113c are inactivated, unused, and/or powered off.

However, in the dual-channel modes, memory cores 114b and memory cores 114ca re configured to be accessed via the remaining two active channels. For example, memory cores 114b may be accessed via channel A 110a, and memory cores 114c may be accessed via channel D 110d. Memory cores 114b being able to be accessed via channel A 110a in the dual-channel mode is illustrated in FIG. 1B by the arrows from channel A interface 112a and channel A control circuitry 113a to and from memory cores 114b (which in quad channel mode are accessed via channel B 110b.) Memory cores 114c being able to be accessed via channel D 110d in the dual-channel mode is illustrated in FIG. 1B by the arrows from channel D interface 112d and channel D control circuitry 113d to and from memory cores 114c (which in quad channel mode would be accessed via channel C 110c.) Thus, in an embodiment, the amount of memory accessible via channel A 110a is increased in the dual-channel mode (e.g., doubled if memory cores 114a and 114b each have the same capacity.) Likewise, the amount of memory accessible via channel D 110d is increased in the dual-channel mode (e.g., doubled if memory cores 114c and 114d each have the same capacity.)

As described herein, in an embodiment, sets of two channels A-D 110a-110d may share common clocking signal(s). In an embodiment, the pairs of channels that share common clocking signals include one channel (e.g., channel A) that is active in the second mode and one channel that is inactive in the second mode (e.g., channel B).

Figure 1C:
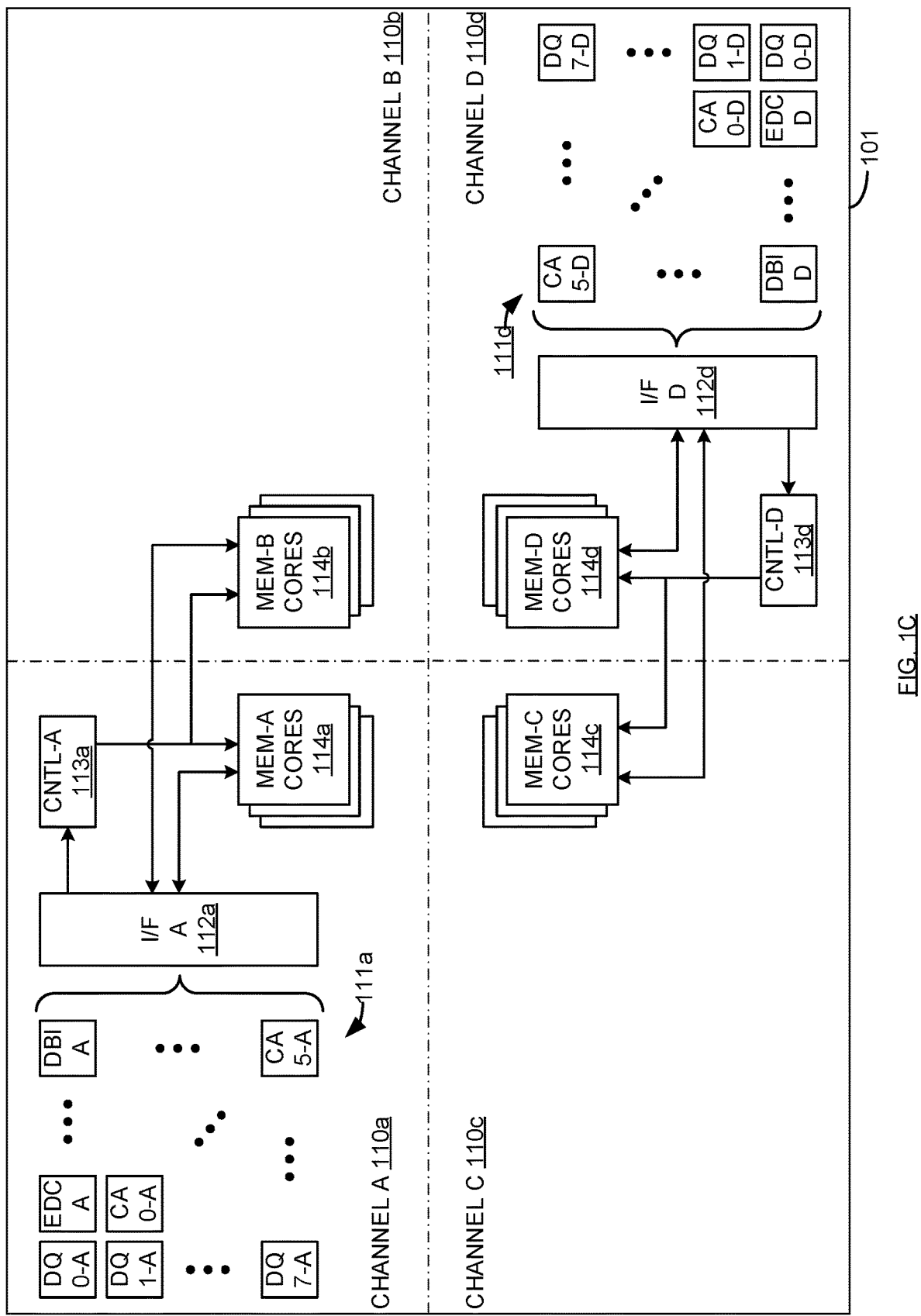
FIG. 1C is a block diagram illustrating example active circuitry when the quad-channel DRAM is in the second mode.

FIG. 1C is a block diagram illustrating example active circuitry when the quad-channel DRAM is in the second mode. In FIG. 3, the inactive, unused, and/or powered down circuitry is not shown. The circuitry that is active in the dual-channel mode is shown. Thus, in FIG. 1C, channel A electrical connection points 111a, channel A interface circuitry 112a, control circuitry 113a, memory cores 114a, memory cores 114b are shown. FIG. 1C also illustrates the active couplings in dual-channel mode between: interface circuitry 112a and control circuitry 113a; control circuitry 113a and memory cores 114a; control circuitry 113a and memory cores 114b; memory cores 114a and interface circuitry 112a; and memory cores 114b and interface circuitry 112a. Likewise, in FIG. 1C, channel D electrical connection points 111d, channel D interface circuitry 112d, control circuitry 113d, memory cores 114d, memory cores 114c are shown. FIG. 1C also illustrates the active couplings in dual-channel mode between: interface circuitry 112d and control circuitry 113d; control circuitry 113d and memory cores 114d; control circuitry 113d and memory cores 114c; memory cores 114d and interface circuitry 112d; and memory cores 114c and interface circuitry 112d.

Figure 2B:
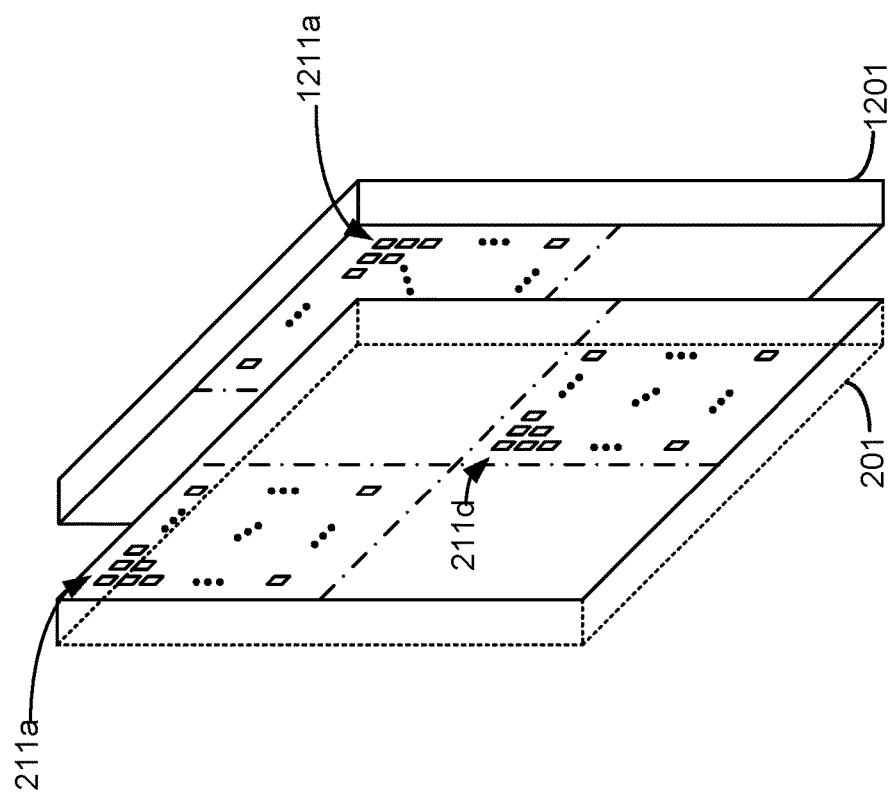
FIG. 2B illustrates, with the substrate removed for clarity, the first and second quad-channel DRAMs oppositely mounted to utilize dual-channel mode.

FIG. 2A illustrates a first and second quad-channel DRAM oppositely mounted to utilize dual-channel mode. In FIGS. 2A-2B, memory system 200 comprises a first quad-channel device 201, a second quad-channel device 1201, and a substrate 250. The first quad-channel device 201 is disposed on a first side of substrate 250. The second quad-channel device 1201 is disposed on a second and opposite side of substrate 250. In FIG. 2, the active electrical connection points 211a and 211d of the first quad-channel device 201 are illustrated. Active electrical connection points 211a (e.g., channel A electrical connection points 111a) are illustrated in the upper left quadrant of quad-channel device 201 (as viewed through the top of the package, where the electrical connection points are on the bottom of the package.) Active electrical connection points 211d (e.g., channel D electrical connection points 111d) are illustrated in the lower right quadrant of quad-channel device 201. The upper right and lower left quadrants of quad-channel device 201 are illustrated as blank in FIG. 2A to represent electrical connection points (e.g., electrical connection points 111b and 111c, respectively) that are inactive, unused, and/or unconnected to substrate 250.

FIG. 2B illustrates, with the substrate removed for clarity, the first and second quad-channel DRAMs oppositely mounted to utilize dual-channel mode. In FIG. 2B, as in FIG. 2A, active electrical connection points 211a are illustrated in the upper left quadrant of quad-channel device 201 (as viewed through the top of the package, where the electrical connection points are on the bottom of the package.) Active electrical connection points 211d are illustrated in the lower right quadrant of quad-channel device 201 when viewed from the same perspective. The upper right and lower left quadrants of quad-channel device 201 are illustrated as blank in FIG. 2B.

In addition, in FIG. 2B, active electrical connection points 1211a are illustrated in the upper right quadrant of quad-channel device 1201 (when viewed from the bottom of the package, where the electrical connection points are on the bottom of the package.) When viewed from the perspective of the top of quad-channel device 1211a, electrical connection points 1211a would be in the upper left quadrant of quad-channel device 1201. Note that when viewed from the respective tops of their packages, active electrical connections points 211a and 1211a occupy the same quadrant (i.e., upper left.) Thus, when in dual-channel mode, electrical connection points 211a and 1211a correspond to the same channel (e.g., channel A 111a in FIGS. 1A-1C.) Likewise, but not shown in FIG. 2B, electrical connection points in the lower right quadrant of quad-channel device 1201 (when viewed from top of 1201) correspond to the same channel as electrical connection points 211d of quad-channel device 201 (e.g., channel D 111d in FIG. 1A-1C.)

It should be noted that the inactive upper right quadrant of quad-channel device 201 is aligned with and positioned opposite of active electrical connection points 1211a of quad-channel device 1201. Likewise, but not shown in FIG. 2B, the inactive lower left quadrant of quad-channel device 201 is aligned with and positioned opposite of active electrical connection points in the lower right quadrant (viewed from the top) of quad-channel device 1201.

Figure 3B:
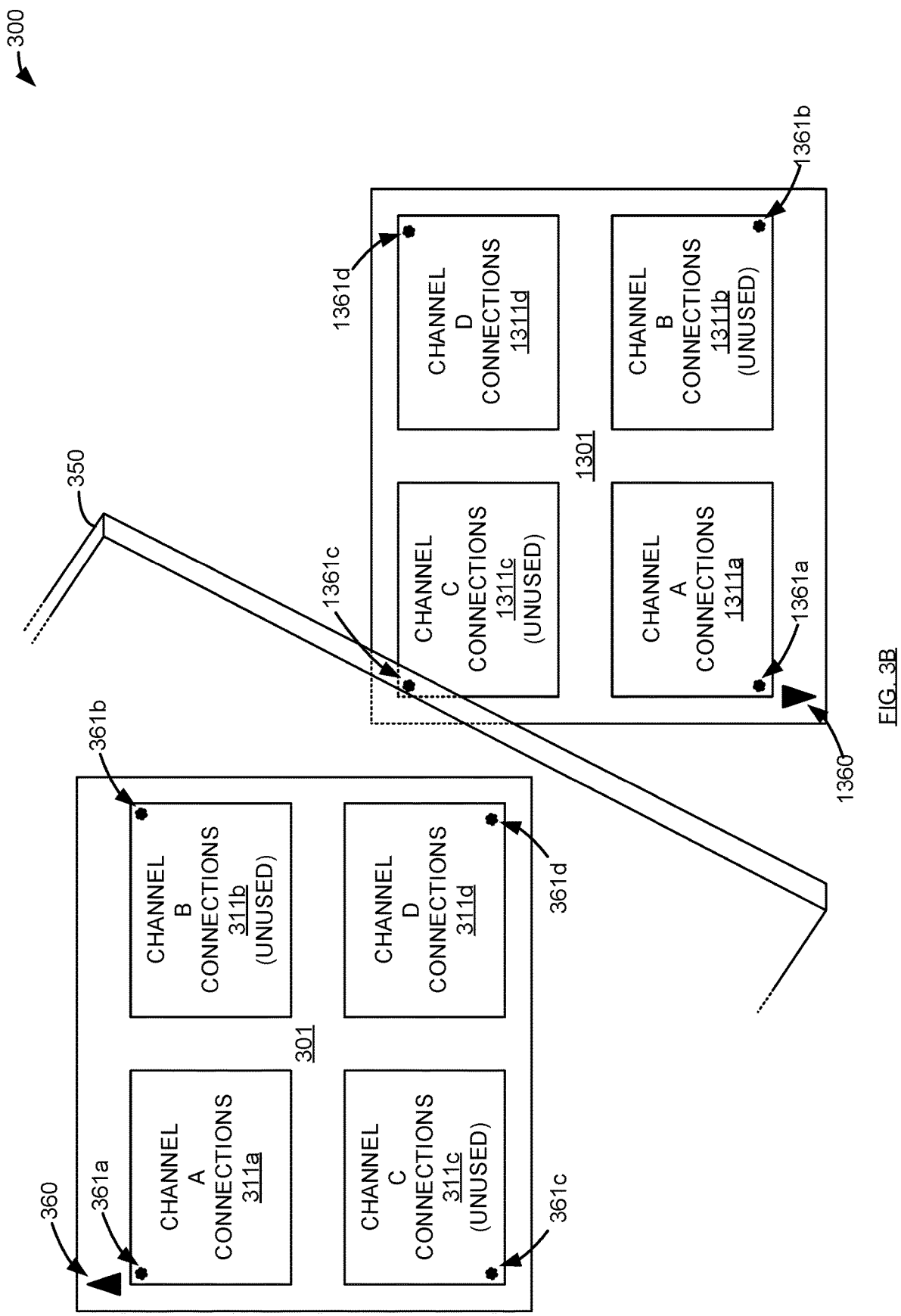
FIG. 3B illustrates a first example device orientation and active channel connection symmetry for a pair of oppositely mounted quad-channel DRAMs.

FIG. 3A illustrates a first example device orientation and active channel connections for a pair of oppositely mounted quad-channel DRAMs. In FIGS. 3A-3C, memory system 300 comprises a first quad-channel device 301, a second quad-channel device 1301, and a substrate 350. Quad-channel device 301 is disposed on a first side of substrate 350 with its bottom (i.e., side with electrical connections/solder balls/pins) towards substrate 350 (and away from the viewer of FIGS. 3A-3C.) When viewed from the perspective of FIGS. 3A-3C: device orientation marker 360 and channel A electrical connections 311a of quad-channel device 301 are in the upper left quadrant; channel B electrical connections 311b are in the upper right quadrant; channel C connections 311c are in the lower left quadrant; and channel D connections 311d are in the lower right.

Quad channel device 1301 is disposed on the opposite side of substrate 350 with its bottom towards substrate 350 (thus, towards the viewer of FIGS. 3A-3C.) When viewed from the perspective of FIGS. 3A-3C, device orientation marker 1360 and channel A electrical connections 1311a of quad-channel device 1301 are in the lower left quadrant; channel B electrical connections 1311b are in the lower right quadrant; channel C connections 1311c are in the upper left quadrant; and channel D connections 1311d are in the upper right.

As can be observed from FIGS. 3A-3C, when devices 301 and 1301 are in dual-channel mode, active channel A connections 311a of device 301 are disposed opposite of and aligned with the inactive channel C connections 1311c of device 1301; inactive channel B connections 311b of device 301 are disposed opposite of and aligned with active channel D connections 1311d of device 1301; inactive channel C connections 311c of device 301 are disposed opposite of and aligned with active channel A connections 1311a of device 1301; and, active channel D connections 311d of device 301 are disposed opposite of and aligned with the inactive channel B connections 1311b of device 1301.

FIG. 3B illustrates a first example device orientation and active channel connection symmetry for a pair of oppositely mounted quad-channel DRAMs. In FIG. 3B, channel connections 311a-311d and 1311a-1311d, and device orientation markers 360 and 1360 are disposed in the same positions as illustrated in FIG. 3A. A channel connection orientation marker 361a is shown in the upper left corner of channel A connections 311a. Channel connection orientation marker 361b is shown in the upper right corner of channel B connections 311b. Channel connection orientation marker 361c is shown in the lower left corner of channel C connections 311c. Channel connection orientation marker 361d is shown in the lower right corner of channel D connections 311d.

In an embodiment, channel connections 311a-311d have the same signal to physical position (e.g., grid location) layout except are mirrored from each other along one or more reflective symmetry lines. This is illustrated by the locations of connection orientations markers 361a-361c (which, for example, could correspond to a particular physical connection location—e.g., pad, ball, pin, etc.) Thus, for example, channel B connections 311b have the same layout as the channel A connections 311a except that, as illustrated by the locations of orientation markers 361a and 361b, the channel B connections 311b are mirrored from the channel A connection positions along a line that lies between them. When mirrored along a vertical line (in FIG. 3B) between channel A connections 311*a* and channel B connections 311*b*, orientation marker 361*b* (and corresponding other connection points etc.) moves to the righthand side of channel B connections 311*b* as compared to the left-hand side of channel A connections 311*a*.

Channel C connections 311*c* have the same layout as the channel A connections 311*a* except that, as illustrated by the locations of orientation markers 361*a* and 361*c*, the channel C connections 311*c* are mirrored from the channel A connection positions along a line that lies between them. When mirrored along a horizontal line (in FIG. 3B) between channel A connections 311*a* and channel C connections 311*c*, orientation marker 361*c* (and corresponding other connection points etc.) moves to the bottom of channel C connections 311*ca* s compared to the top of channel A connections 311*a*.

Channel D connections 311*d* have the same layout as the channel A connections 311*a* except that, as illustrated by the locations of orientation markers 361*a* and 361*d*, the channel D connections 311*d* are mirrored from the channel A connection positions along two lines: a first symmetry line that lies between channel A connections 311*a* and channel B connections 311*b* (and also lies between channel C connections 311*c* and channel D connections 311*d*), and a second symmetry line that lies between channel A connections 311*a* and channel C connections 311*c* (and also lies between channel B connections 311*b* and channel D connections 311*d*). When mirrored along these lines (one horizontal line and one vertical in FIG. 3B), orientation marker 361*d* (and corresponding other connection points etc.) move to the bottom right hand corner of channel D connections 311*d* as compared to the top left-hand corner of channel A connections 311*a*.

Since quad-channel device 301 and quad-channel device 1301 have the same layout of channel connections 311*a*-311*d*, 1301*a*-1301*d*, the physical connection positions of 1301*a*-1301*d* have the same mirroring. This is illustrated by the locations of orientation markers 1361*a*-1361*d* in FIGS. 3B-3C.

It should be understood that, in an embodiment, there may be one or more individual signals (e.g., low-speed signals such as a reset signal and/or reference voltages) that don't physically mirror perfectly. For example, a given data signal (e.g., DQ0) may mirror with another data signal (e.g., DQ4) that performs the same function and/or has the same meaning. In another embodiment, a majority or substantially all of the individual signals of a channel are mirrored with another channel and those that are not perfectly mirrored are close to the mirrored location so that a small amount of routing is used on the substrate between the DRAMs to connect them.

In an embodiment, the DRAM includes one or more registers to store a register value that determines top-side/bottom side modes such that the package balls are coupled to the internal circuits in a manner that the signals are mirrored between the two modes. For example, this register value (i.e., mode) may be set by a memory controller via one or more of the channels. The memory controller includes an interface that issues a mode register set (MRS) command, along with the register value to the memory device. The DRAM receives the MRS command and stores the register value in the register to set the top-side/bottom side (or other variants) mode. In another example, the register value may also be set using serial presence detect circuitry where parameter information pertaining to the DRAM, stored in a memory device (such as a serial presence detect (SPD) device) or the DRAM itself is read by the memory controller or other interface. The memory controller then, based on the parameter information, sets the top-side/bottom side mode using one of the methods described herein. In another example, the register value (or the top-side/bottom side mode) may be set by a signal (i.e., voltage) asserted on a pin during power-up, reset, and/or normal operating state The memory controller may assert the voltage on the pin which is included on the DRAM. In another embodiment, two different package designs can be used for when the device is placed on top of the substrate or the bottom so that the signals are mirrored. These different package designs may also be configured set the signal (i.e., voltage) on a pin of the DRAM that determines the mode.

FIG. 3C illustrates a first example active to inactive channel connection correspondence for a pair of oppositely mounted quad-channel DRAMs. As is illustrated in FIG. 3C, the physical location of orientation marker 361*a* corresponds to the physical location of orientation marker 1361*c* (but on the other side of substrate 350). Thus, the physical location of a pad/ball/etc. connection corresponding to a given signal in channel A 311*a* corresponds to and is opposite of the physical location of a pad/ball/etc. of the same signal in channel C 1311*c*. This is illustrated in FIG. 3C by arrow 371 running between orientation marker 361*a* to orientation marker 1361*c*. The same relationship holds for the physical connection locations of the individual signals of channel D connections 311*d* and channel B connections 1311*b* (illustrated by arrow 372 running between orientation marker 361*d* and orientation marker 1361*b*); the physical connection locations of the individual signals of channel C connections 311*c* and channel A connections 1311*a* (illustrated by arrow 373 running between orientation marker 361*c* and orientation marker 1361*a*); and, the physical connection locations of the individual signals of channel B connections 311*b* and channel D connections 1311*d* (illustrated by arrow 374 running between orientation marker 361*b* and orientation marker 1361*d*).

Figure 4A:
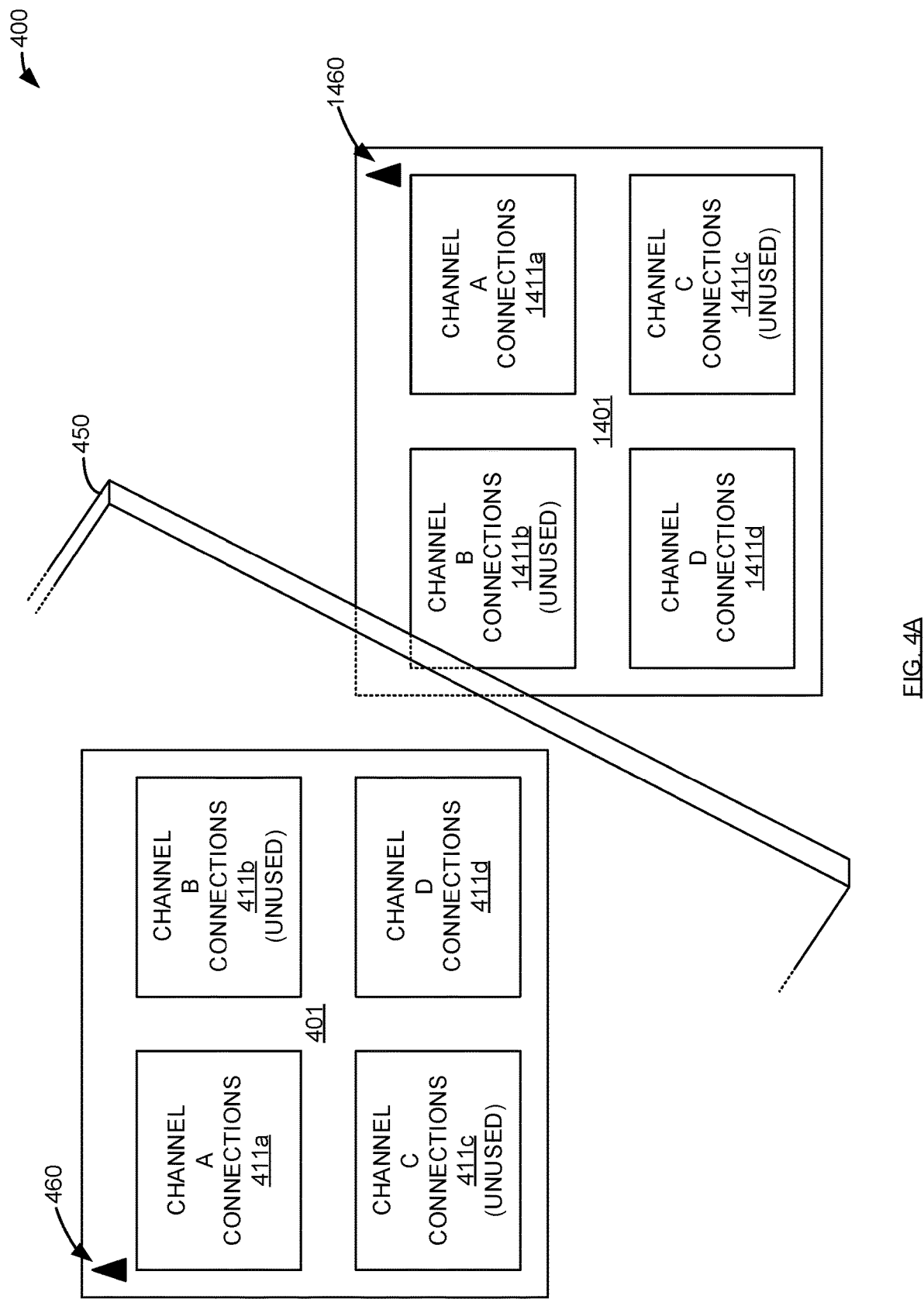
FIG. 4A illustrates a second example device orientation and active channel connections for a pair of oppositely mounted quad-channel DRAMs.
Figure 4B:
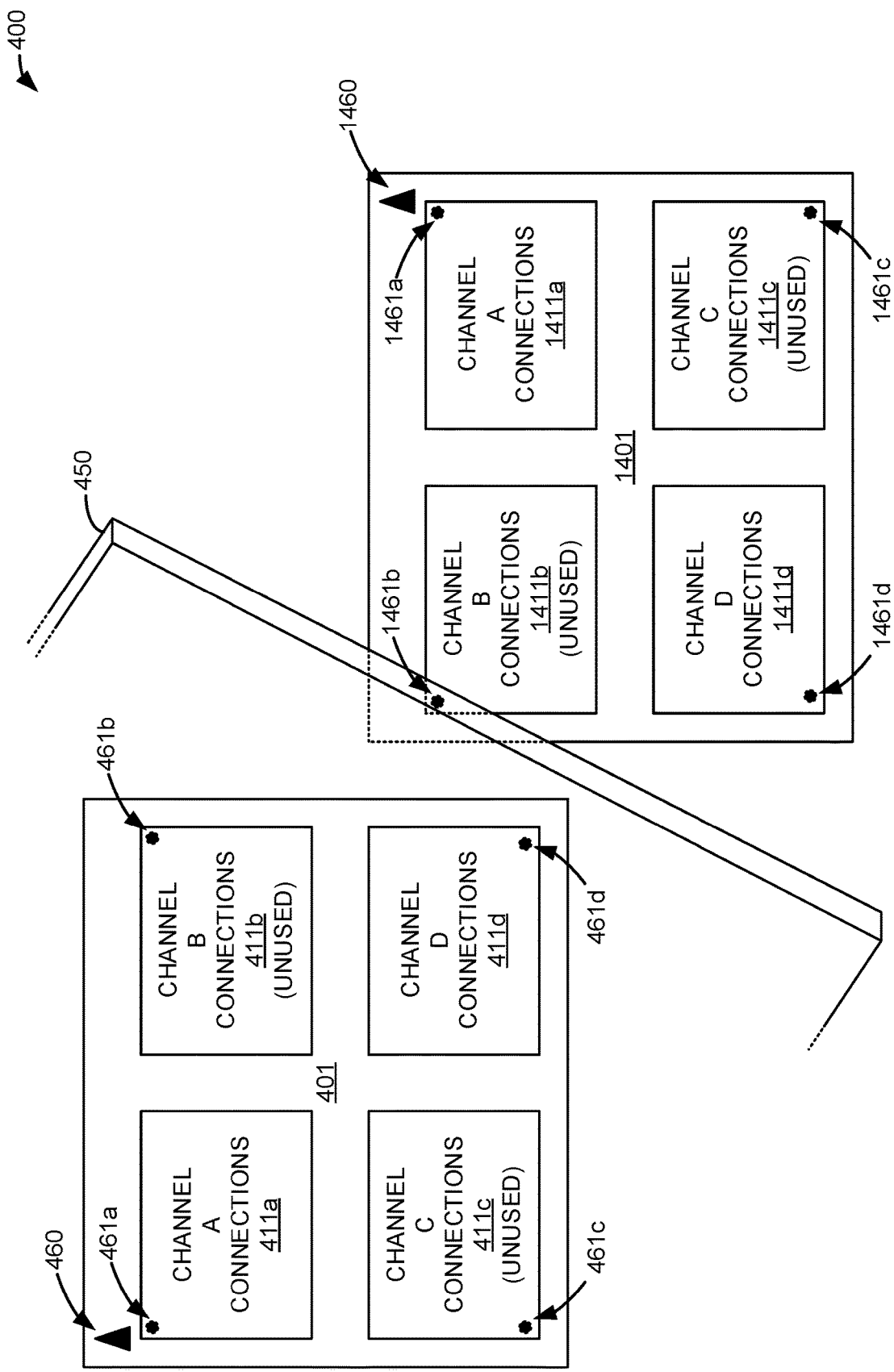
FIG. 4B illustrates a second example device orientation and active channel connection symmetry for a pair of oppositely mounted quad-channel DRAMs.
Figure 4C:
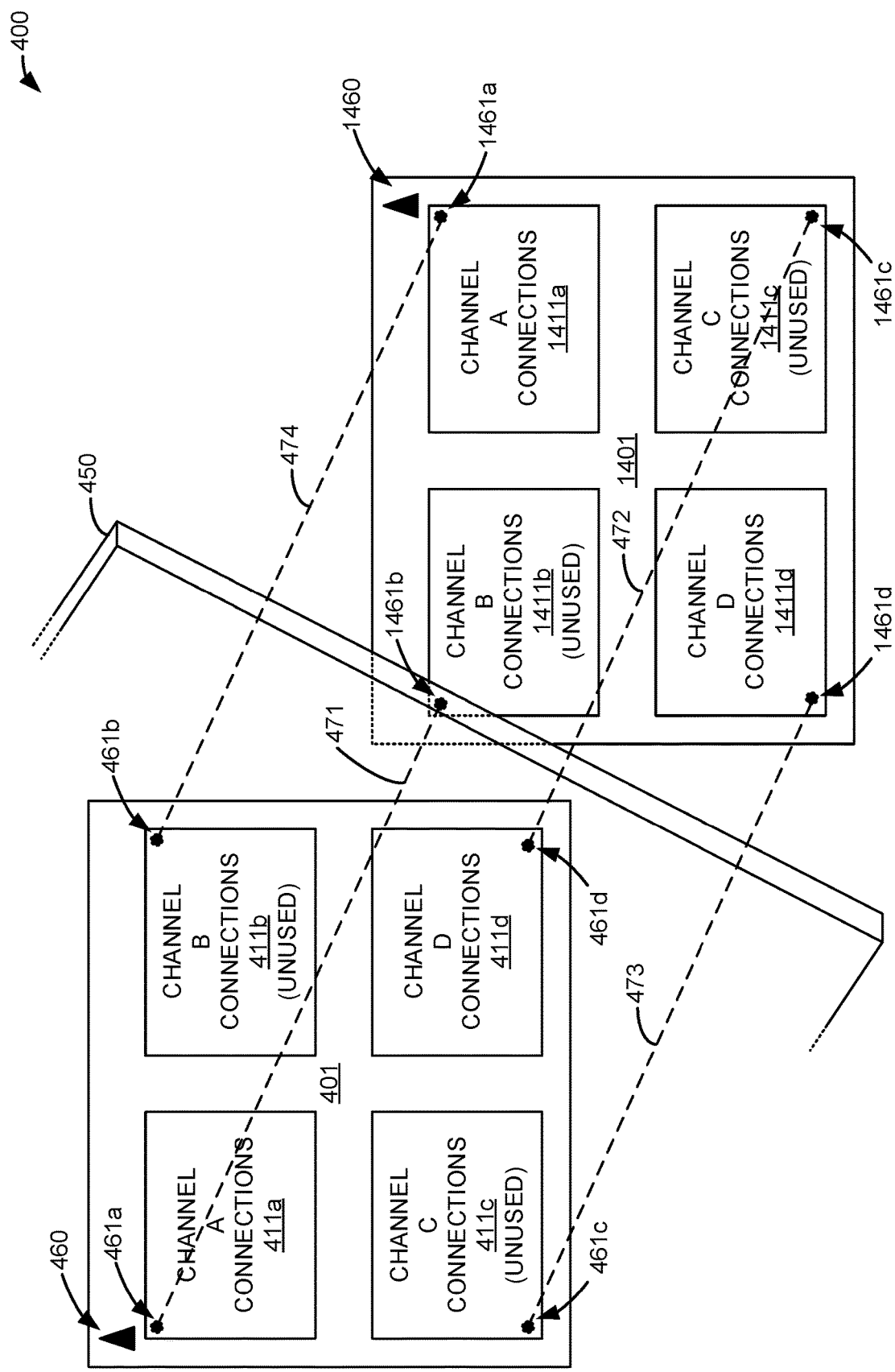
FIG. 4C illustrates a second example active to inactive channel connection correspondence for a pair of oppositely mounted quad-channel DRAMs.

FIG. 4A illustrates a second example device orientation and active channel connections for a pair of oppositely mounted quad-channel DRAMs. In FIGS. 4A-4C, memory system 400 comprises a first quad-channel device 401, a second quad-channel device 1401, and a substrate 450. Quad-channel device 401 is disposed on a first side of substrate 450 with its bottom (i.e., side with electrical connections/solder balls/pins) towards substrate 450 (and away from the viewer of FIGS. 4A-4C.) When viewed from the perspective of FIGS. 4A-4C: device orientation marker 460 and channel A electrical connections 411*a* of quad-channel device 401 are in the upper left quadrant; channel B electrical connections 411*b* are in the upper right quadrant; channel C connections 411*c* are in the lower left quadrant; and channel D connections 411*d* are in the lower right.

Quad channel device 1401 is disposed on the opposite side of substrate 450 with its bottom towards substrate 450 (towards the viewer of FIGS. 4A-4C.) When viewed from the perspective of FIGS. 4A-4C, device orientation marker 1460 and channel A electrical connections 1411*a* of quad-channel device 1401 are in the upper right; channel B electrical connections 411*b* are in the upper left; channel C connections 1 411*c* are in the lower right quadrant; and channel D connections 1411*d* are in the lower left quadrant.

As can be observed from FIGS. 4A-4C, when devices 401 and 1401 are in dual-channel mode, active channel A connections 411*a* of device 401 are disposed opposite of and aligned with the inactive channel B connections 1411*b* of device 1401; inactive channel B connections 411*b* are disposed opposite of and aligned with active channel A connections 1411*a* of device 1401; inactive channel C connections 411c are disposed opposite of and aligned with active channel D connections 1411d of device 1401; and, active channel D connections 411d of device 401 are disposed opposite of and aligned with the inactive channel C connections 1411c of device 1401.

In an embodiment, channel connections 411a-411d and 1411a-1411d have the same signal to physical position (e.g., grid location) layout except are mirrored from each other along one or more reflective symmetry lines. This is illustrated by the locations of connection orientations markers 461a-461d and 1461a-1461d (which, for example, could correspond to a particular signal physical connection location.) The mirroring of physical connections to signal assignments along symmetry lines between channel connections 411a-411d and 1411a-1411d was discussed previously with reference to FIGS. 3A-3C (311a-311d and 1311a-1311d) and thus, for the sake of brevity, will not be repeated here.

FIG. 4C illustrates a second example active to inactive channel connection correspondence for a pair of oppositely mounted quad-channel DRAMs. As is illustrated in FIG. 4C, the physical location of orientation marker 461a corresponds to the physical location of orientation marker 1461b (but on the other side of substrate 450). Thus, the physical location of a pad/ball/etc. connection corresponding to a given signal in channel A 411a corresponds to and is opposite of the physical location of a pad/ball/etc. of the same signal in channel B 1411b. This is illustrated in FIG. 4C by arrow 471 running between orientation marker 461a to orientation marker 1461b. The same relationship holds for the physical connection locations of the individual signals of channel D connections 411d and channel C connections 1411c (illustrated by arrow 472 running between orientation marker 461d and orientation marker 1461c); the physical connection locations of the individual signals of channel C connections 411c and channel D connections 1411d (illustrated by arrow 473 running between orientation marker 461c and orientation marker 1461d); and, the physical connection locations of the individual signals of channel B connections 411b and channel A connections 1411a (illustrated by arrow 474 running between orientation marker 461b and orientation marker 1461a).

Figure 5A:
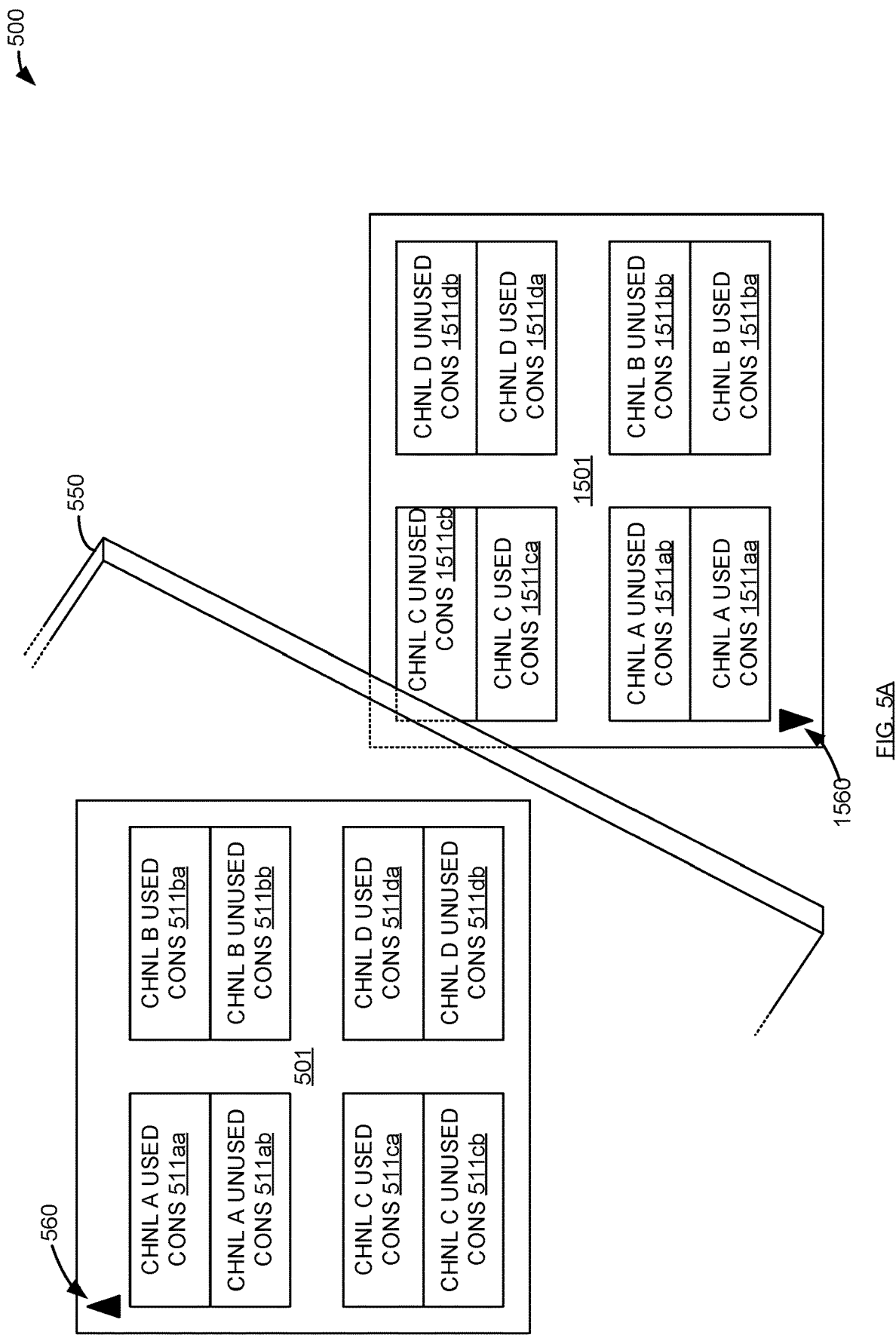
FIG. 5A illustrates a first example device orientation using partial per-channel connections for a pair of oppositely mounted quad-channel DRAMs.

FIG. 5A illustrates a first example device orientation using partial per-channel connections for a pair of oppositely mounted quad-channel DRAMs. In FIGS. 5A-5B, memory system 500 comprises a first quad-channel device 501, a second quad-channel device 1501, and a substrate 550. Quad-channel device 501 is disposed on a first side of substrate 550 with its bottom (i.e., side with electrical connections/solder balls/pins) towards substrate 550 (and away from the viewer of FIGS. 5A-5B.) When viewed from the perspective of FIGS. 5A-5B: device orientation marker 560 and channel A electrical connections 511aa-511ab, of quad-channel device 501 are in the upper left quadrant; channel B electrical connections 511ba-511bb are in the upper right quadrant; channel C connections 511ca-511cb are in the lower left quadrant; and channel D connections 511da-511db are in the lower right.

Quad channel device 1501 is disposed on the opposite side of substrate 550 with its bottom towards substrate 550 (i.e., towards the viewer of FIGS. 5A-5B.) When viewed from the perspective of FIGS. 5A-5B, device orientation marker 1560 and channel A electrical connections 1511aa-1511ab of quad-channel device 1501 are in the lower left quadrant; channel B electrical connections 1511ba-1511bb are in the lower right quadrant; channel C connections 1511ca-1511cb are in the upper left quadrant; and channel D connections 1511da-1511db are in the upper right.

In FIGS. 5A-5B, channel connections 511aa, 511ba, 511ca, 511da, 1511aa, 1511ba, 1511ca, and 1511da are active in the dual-channel mode. Channel connections 511ab, 511bb, 511cb, 511d b, 1511ab, 1511bb, 1511cb, and 1511db are inactive in the dual-channel mode. Thus, for any given group of channel A, B, C, or D connections, a portion of the connections are active and a portion of the connections are inactive.

As can be observed from FIGS. 5A-5B, when devices 501 and 1501 are in dual-channel mode, the active portion of channel A connections 511aa of device 501 are disposed opposite of and aligned with the inactive portion of channel C connections 1511cb of device 1301; the inactive portion of channel B connections 511bb are disposed opposite of and aligned with the active portion of channel D connections 1511da of device 1501; the inactive portion of channel C connections 511cb are disposed opposite of and aligned with the active portion of channel A connections 1511aa of device 1501; the active portion of channel D connections 511da of device 501 are disposed opposite of and aligned with the inactive portion of channel B connections 1511bb of device 1501; the inactive portion of channel A connections 511ab are disposed opposite of and aligned with the active portion of channel C connections 1511ca; the active portion of channel B connections 511ba are disposed opposite of and aligned with the inactive portion of channel D connections 1511db of device 1501; the active portion of channel C connections 511ca are disposed opposite of and aligned with the inactive portion of channel A connections 1511ab of device 1501; and, the inactive portion of channel D connections 511db of device 501 are disposed opposite of and aligned with the active portion of channel B connections 1511ba of device 1501.

FIG. 5B illustrates a first example active to inactive partial per-channel connection correspondence for a pair of oppositely mounted quad-channel DRAMs. In particular, the physical location correspondence between signals in the inactive portion of channel C connections 511cb and the physical location of signals in the active portion of channel A connections 1511aa is illustrated by arrow 571. The physical location correspondence between signals in the active portion of channel B connections 511ba and the physical location of signals in the inactive portion of channel D connections 1511db is illustrated by arrow 572. Further discussion of the other physical location correspondences present between the active/inactive signals of devices 501 and 1501 are omitted herein for the sake of brevity.

Figure 6A:
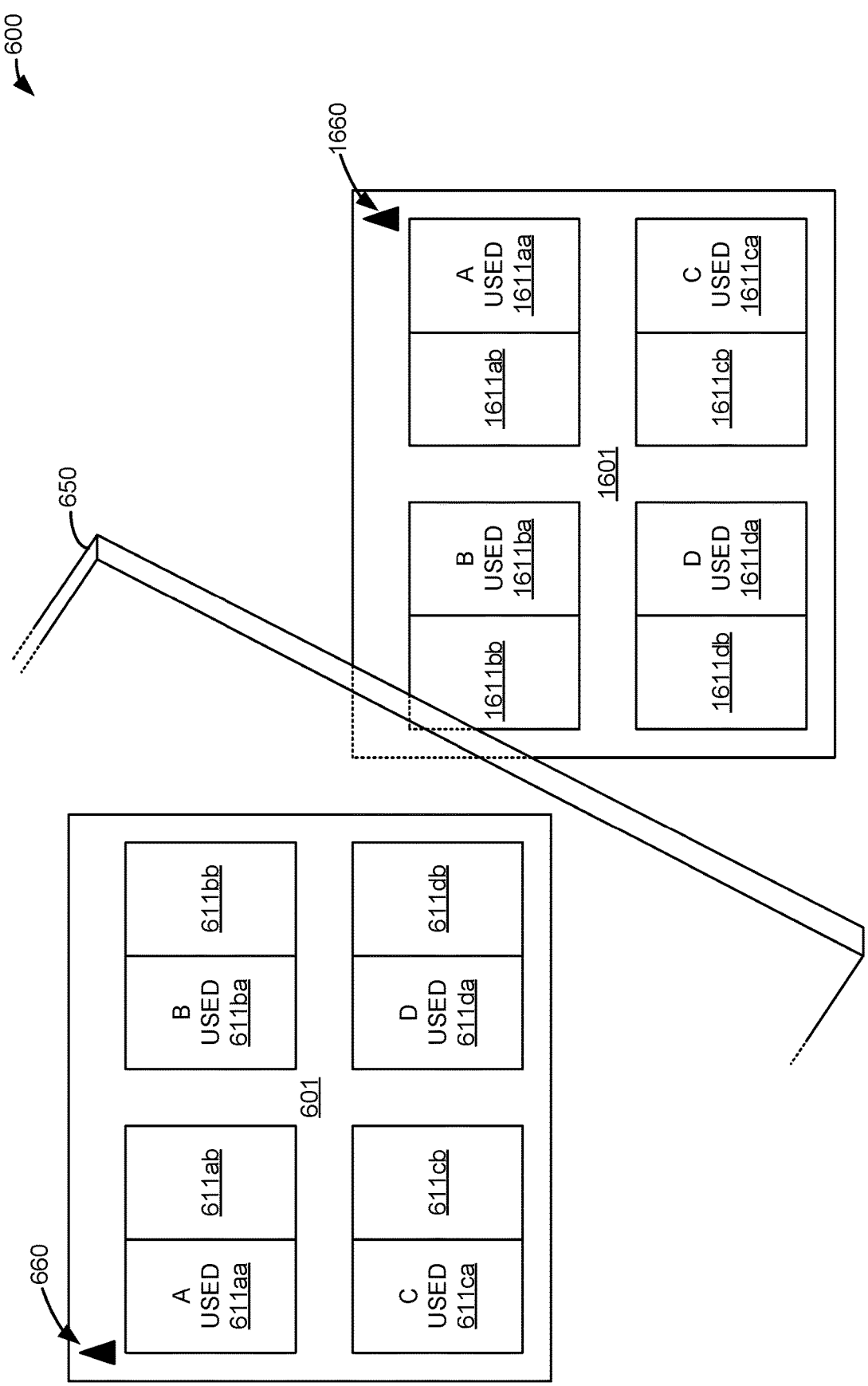
FIG. 6A illustrates a second example device orientation using partial per-channel connections for a pair of oppositely mounted quad-channel DRAMs.
Figure 6B:
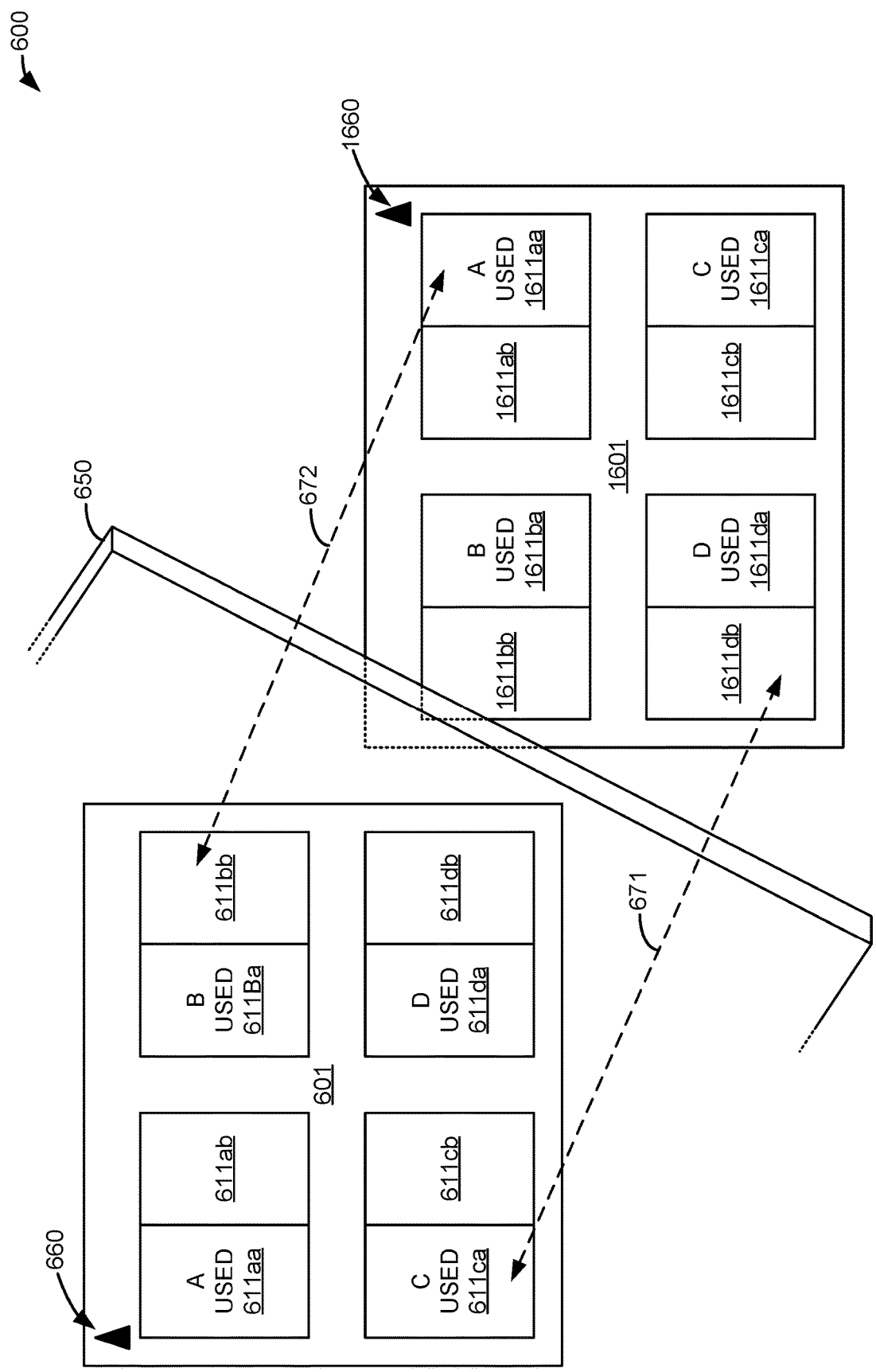
FIG. 6B illustrates a second example active to inactive partial per-channel connection correspondence for a pair of oppositely mounted quad-channel DRAMs.

FIG. 6A illustrates a second example device orientation using partial per-channel connections for a pair of oppositely mounted quad-channel DRAMs. In FIGS. 6A-6B, memory system 600 comprises a first quad-channel device 601, a second quad-channel device 1601, and a substrate 650. Quad-channel device 601 is disposed on a first side of substrate 650 with its bottom (i.e., side with electrical connections/solder balls/pins) towards substrate 650 (and away from the viewer of FIGS. 6A-6B.) When viewed from the perspective of FIGS. 6A-6B: device orientation marker 660 and channel A electrical connections 611aa-611ab, of quad-channel device 601 are in the upper left quadrant; channel B electrical connections 611ba-611bb are in the upper right quadrant; channel C connections 611ca-611cb are in the lower left quadrant; and channel D connections 611da-611db are in the lower right.

Quad channel device 1601 is disposed on the opposite side of substrate 650 with its bottom towards substrate 650

(i.e., towards the viewer of FIGS. 6A-6B.) When viewed from the perspective of FIGS. 6A-6B, device orientation marker 1660 and channel A electrical connections 1611aa-1611ab of quad-channel device 1601 are in the upper right quadrant; channel B electrical connections 1611ba-1611bb are in the upper left quadrant; channel C connections 1611ca-1611cb are in the lower right quadrant; and channel D connections 1611da-1611db are in the lower left.

In FIGS. 6A-6B, channel connections 611aa, 611ba, 611ca, 611da, 1611aa, 1611ba, 1611ca, and 1611da are active in the dual-channel mode. Channel connections 611ab, 611bb, 611cb, 611db, 1611ab, 1611bb, 1611cb, and 1611db are inactive in the dual-channel mode. Thus, for any given group of channel A, B, C, or D connections, a portion of the connections are active and a portion of the connections are inactive.

As can be observed from FIGS. 6A-6B, when devices 601 and 1601 are in dual-channel mode, the active portion of channel A connections 611aa of device 601 are disposed opposite of and aligned with the inactive portion of channel B connections 1611bb of device 1601; the inactive portion of channel B connections 611bb are disposed opposite of and aligned with the active portion of channel A connections 1611aa of device 1601; the inactive portion of channel C connections 611cb are disposed opposite of and aligned with the active portion of channel D connections 1611da of device 1601; the active portion of channel D connections 611da of device 601 are disposed opposite of and aligned with the inactive portion of channel C connections 1611cb of device 1601, the inactive portion of channel A connections 611ab of device 601 are disposed opposite of and aligned with the active portion of channel B connections 1611ba of device 1601; the active portion of channel B connections 611ba are disposed opposite of and aligned with the inactive portion of channel A connections 1611ab of device 1601; the active portion of channel C connections 611ca are disposed opposite of and aligned with the inactive portion of channel D connections 1611db of device 1601; and, the inactive portion of channel D connections 611db of device 601 are disposed opposite of and aligned with the active portion of channel C connections 1611ca of device 1601.

FIG. 6B illustrates a first example active to inactive partial per-channel connection correspondence for a pair of oppositely mounted quad-channel DRAMs. In particular, the physical location correspondence between signals in the active portion of channel C connections 611ca and the physical location of signals in the inactive portion of channel D connections 1611db is illustrated by arrow 671. The physical location correspondence between signals in the inactive portion of channel B connections 611bb and the physical location of signals in the active portion of channel A connections 1611aa is illustrated by arrow 672. Further discussion of the other physical location correspondences present between the active/inactive signals of devices 601 and 1601 are omitted herein for the sake of brevity.

Figure 7A:
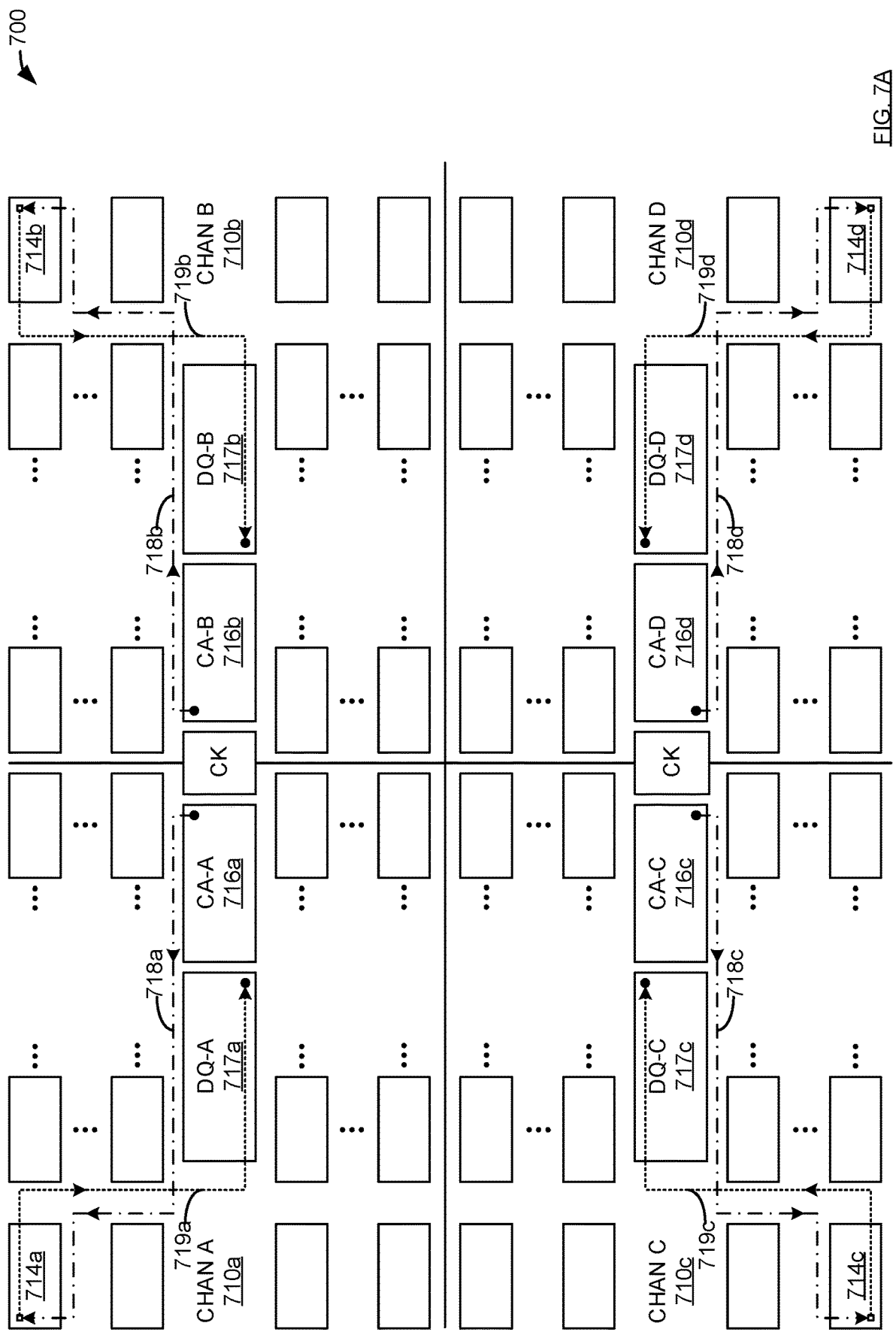
FIG. 7A illustrates an example floorplan for a quad-channel DRAM and example worst-case latency paths in quad-channel mode.

FIG. 7A illustrates an example floorplan for a quad-channel DRAM and example worst-case latency paths in quad-channel mode. In FIG. 7A, memory device 700 is configured with four active channels: channel A 710a, channel B 710b, channel C 710c, and channel D 710d. The active circuitry/logic for channel A 710a when DRAM device 700 is configured in the four active channel (a.k.a., quad-channel) mode comprises a set of memory cores 714a that are accessed using channel A data (DQ) circuitry 717a, and channel A command/address (CA) circuitry 716a. The active circuitry/logic for channel B 710b when DRAM device 700 is configured in quad-channel mode comprises a set of memory cores 714b that are accessed using channel B data (DQ) circuitry 717b, and channel B command/address (CA) circuitry 716b. The active circuitry/logic for channel C 710c when DRAM device 700 is configured in quad-channel mode comprises a set of memory cores 714c that are accessed using channel C data (DQ) circuitry 717c, and channel C command/address (CA) circuitry 716c. The active circuitry/logic for channel D 710d when DRAM device 700 is configured in quad-channel mode comprises a set of memory cores 714d that are accessed using channel D data (DQ) circuitry 717d, and channel D command/address (CA) circuitry 716d.

Also illustrated in FIG. 7A are example worst case access paths for each of the channels 710a-710d. An example worst case access path for CA distribution by channel A 710a is illustrated by arrow 718a. Arrow 718a runs from channel A CA interface circuitry 716a to the memory core 714a in the upper-left corner of channel A circuitry 710a. An example worst case data path returning from the memory core 714a in the upper-left corner of channel A circuitry 710a to channel A DQ interface circuitry 717a is illustrated by arrow 719a. Similar example worst case CA distribution access paths and DQ return paths are illustrated for channels B-D by arrows 718b-718d, and 719b-719d, respectively.

Figure 7B:
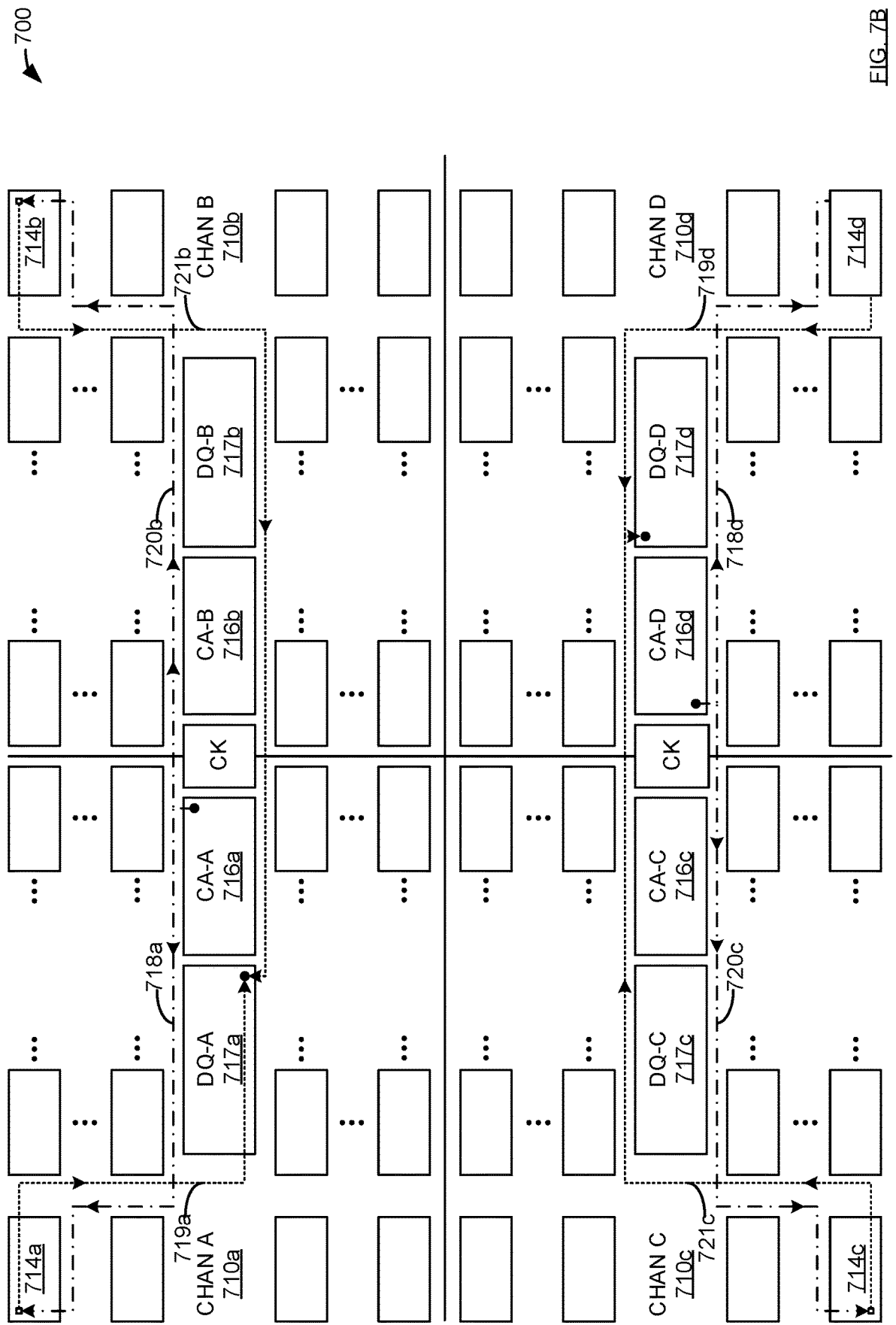
FIG. 7B illustrates an example floorplan for a quad-channel DRAM and example worst-case latency paths in clamshell (dual-channel) mode.

FIG. 7B illustrates an example floorplan for a quad-channel DRAM and example worst-case latency paths in clamshell (dual-channel) mode. In FIG. 7B, memory device 700 is configured with two active channels: channel A 710a and channel D 710d. The memory cores 714b and 714c accessed by channel B 710b and channel C 710c, respectively, in the quad channel mode are accessed by the circuitry (and interfaces) of channel A 710a and channel D 710d, respectively, when memory device 700 is in dual channel mode.

Also illustrated in FIG. 7B are example worst case access paths for each of the channels 710a and 710d. An example worst case access path for CA distribution for memory cores 714a is illustrated by arrow 718a. Arrow 718a runs from channel A CA interface circuitry 716a to the memory core 714a in the upper-left corner of channel A circuitry 710a. An example worst case data path returning from the memory core 714a in the upper-left corner of channel A circuitry 710a to channel A DQ interface circuitry 717a is illustrated by arrow 719a.

In dual-channel mode, the memory cores 714b associated with channel B 710b in the quad channel mode are now accessed via the channel A 710a circuitry. An example worst case access path for CA distribution to memory cores 714b is illustrated by arrow 720b. Arrow 720b runs from channel A CA interface circuitry 716a to the memory core 714b in the upper-right corner of channel B circuitry 710b. An example worst case data path returning from memory core 714b in the upper-right corner of channel B circuitry 710b to channel A DQ interface circuitry 717a is illustrated by arrow 721b. Example worst case CA distribution access path and DQ return path are illustrated for channel C 710c memory cores 714cb y arrows 720c and 721c, respectively. Example worst case CA distribution access path and DQ return path are illustrated for channel D 710d memory cores 714d by arrows 718d and 719d, respectively.

In an embodiment, the extra length of access paths 720b and 721b, as compared to access paths 719a and 719b, may result in additional access latency. For example, 2 additional clock cycle/phases may be used—1 to account for increased CA distribution path delay (path 720b) and 1 for increased DQ return path delay (path 721b). In an embodiment, memory device 700 may be configured to also increase access latencies for channel A 710*a* memory cores 714*a* such that the all accesses via channel A 710*a*, whether to memory cores 714*a* or 714*b* have the same access latency. In another embodiment, the access latencies to memory cores 714*a* may be shorter than the access latencies to memory cores 714*b*. In an embodiment, the most-significant bit (MSB) of the row address may determine whether the access latency is the shorter (i.e., to memory cores 714*a*) or the longer (i.e., to memory cores 714*b*) access latency. To allow for additional processing time in order to determine whether an access is to memory cores 714*a* versus 714*b*, memory device 700 may be configured to receive the MSB of the row access and the bank address early (or at the start of) the command sequence (e.g., received in the first and/or second cycles of the command/address information packet.) Receiving the MSB of the row access and the bank address (or whatever signals determine the quadrant of the access) early in the command sequence allows the decoding of the quadrant before the entire command/address is decoded. This reduces the path delay impact that would otherwise occur if the quadrant information was received later in the command sequence. In another embodiment, a bit of the column address may determine whether the access time is the shorter (i.e., to memory cores 714*a*) or the longer (i.e., to memory cores 714*b*) access time.

Figure 8:
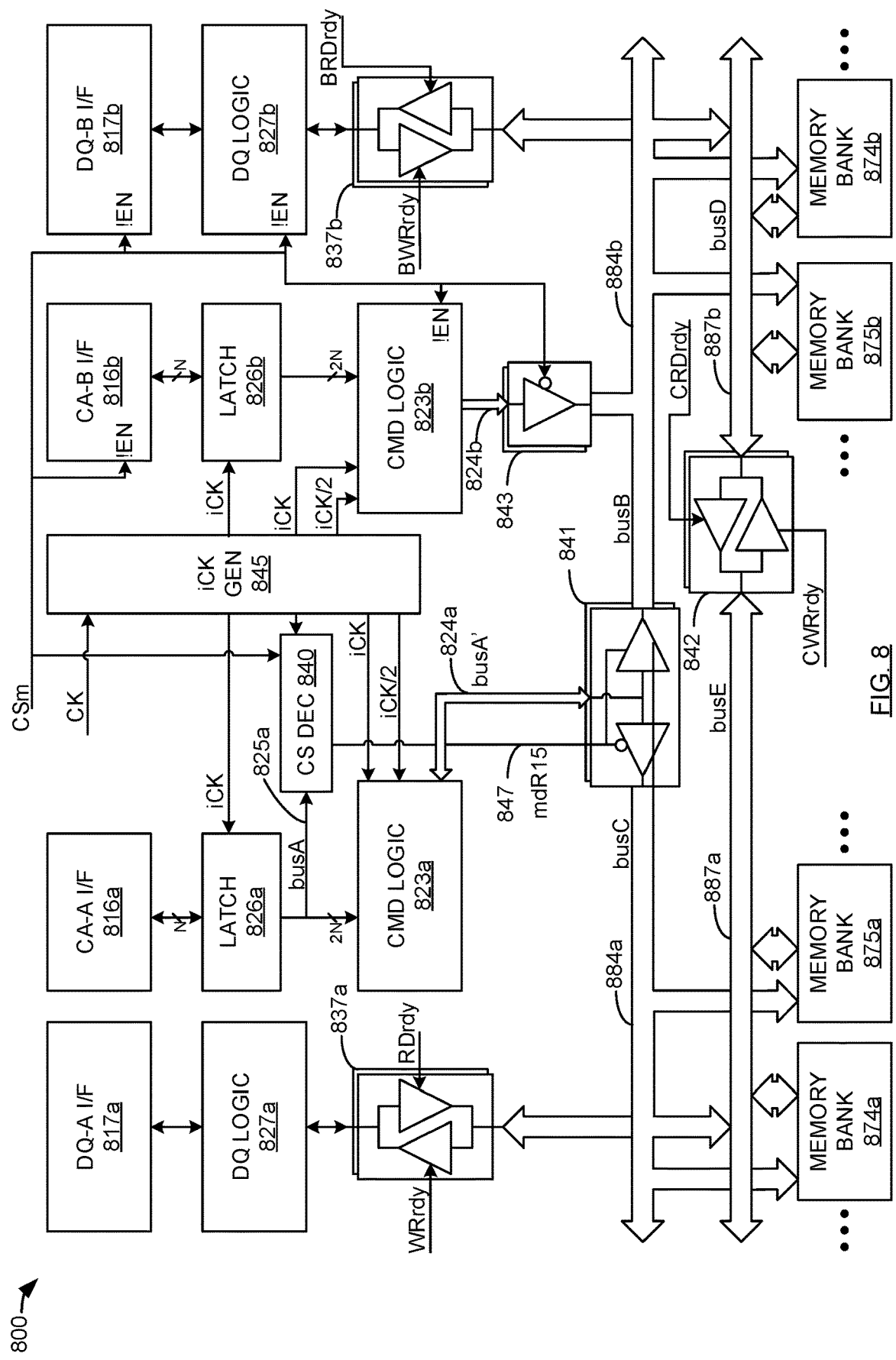
FIG. 8 illustrates an example block diagram for two channels of a quad-channel DRAM.

FIG. 8 illustrates an example block diagram for two channels of a quad-channel DRAM. In FIG. 8, memory device 800 comprises channel A DQ interface circuitry 817*a*, channel B DQ interface circuitry 817*b*, channel A CA interface circuitry 816*a*, channel B CA interface circuitry 816*b*, channel A DQ logic 827*a*, channel B DQ logic 827*b*, channel A CA latch 826*a*, channel B CA latch 826*b*, clamshell mode decoder 840, internal clock (iCK) generation circuitry 845, channel A command logic 823*a*, channel B command logic 823*b*, channel A bi-directional tri-state buffers 837*a*, channel B bi-directional tri-state buffers 837*b*, internal CA steering tri-state buffers 841, internal DQ bus isolation/steering tri-state buffers 842, channel A associated memory banks 874*a*-875*a*, and channel B associated memory banks 874*b*-875*b*.

In an embodiment, DQ interface circuitry 817*a*-817*b* includes circuitry for nine (or alternately eight) bidirectional data signals (e.g., DQ[0:8] or DQ[0:7]), receiving a write clock signal (WCK), and a bidirectional data bus inversion (DBI) signal. Command address interface circuitry 816*a*-816*b* include circuitry for seven command/address signals (e.g., CA[0:6].) Internal clock generation circuitry 845 receives an external clock signal CK. Clock generation circuitry 845 generates and distributes internal clock signals iCK, iCK/2. iCK2 is a ½ frequency version of iCK and includes two phases separated by 180° (e.g., inversions of each other.)

Channel A associated memory banks 874*a*-875*a* are operatively coupled to internal command bus C (busC) 884*a* and internal data bus E (busE) 887*a*. Internal busC 884*a* may include signals corresponding to a row address strobe (RAS), read column address strove (RCAS), write column address strobe (WCAS), and address signals (ADDR). Internal command busA'824*a* is generated by command logic 823*a* from signals received via the output of latch 826*a* (i.e., busA 825*a*). Internal busA 825*a* (or a subset thereof—e.g., MSB of row address) is also provided to clamshell decoder logic 840. Internal busA'824*a* may include signals corresponding to, for channel A associated memory banks 874*a*-875*a* and/or for channel B associated memory banks 874*b*-875*b*, RAS, RCAS, WCAS, and address signals (ADDR).

Channel B associated memory banks 874*b*-875*b* are operatively coupled to internal command bus B (busB) 884*b* and internal data bus D (busD) 887*b*. Internal busB 884*b* may include signals corresponding to, for channel B associated memory banks 874*b*-875*b*, RAS, RCAS, WCAS, and address signals (ADDR).

Tri-state buffers 837*a* selectively couple and uncouple DQ logic 827*a* with internal data bus E (busE) 887*a* under the control of write ready (WRrdy) and read ready (RDrdy) signals. Internal busE 887*a* may include 256 data lines and the RDrdy signal. The RDrdy signal may be generated along with the data being read from a memory bank 874*a*-875*a* (and banks 874*b*-875*b* when memory device 800 is in clamshell mode) and acts as a handshake signal.

When not in clamshell mode, tri-state buffers 837*b* selectively couple and uncouple DQ logic 827*b* with internal data bus D (busD) under the control of B-channel write ready (BWRrdy) and B-channel read ready (BRDrdy) signals. Internal busD may include 256 data lines and the RDrdy signal. The RDrdy signal may be generated along with the data being read from a memory bank 874*b*-875*b* and acts as a handshake signal. Tri-state buffers 837*b* do not couple DQ logic 827*b* with busD 887*b* when memory device 800 is in clamshell mode. Thus, in an embodiment, the signal BWRdy may be generated, at least in part, according to the following logical equation: BWRrdy=!CSm AND WRrdy, where CSm is a logical '1' when memory device 800 is in clamshell mode, and the exclamation point represents a logical NOT (i.e., inversion) operation. The signal BRDrdy may be generated, at least in part, according to the following logical equation: BRDrdy=!CSm AND RDrdy.

Tri-state buffers 841 selectively drive internal command bus A' (busA') to either busB 884*b* or busC 884*a*. When memory device 800 is not in clamshell mode, clamshell decode 840 sets mdR15 signal 847 such that busA' is driven to busC 884*a*. When memory device 800 is in clamshell mode, clamshell decode 840 sets mdR15 signal 847 such that busA' is driven to busC 884*a* if the MSB of the row address (e.g., R15) is logical zero (0) and to busB 884*b* if it is a logical one (1). Thus, in an embodiment, the signal mdR15 may be generated, at least in part, according to the following logical equation: mdR15=CSm AND R15.

Tri-state buffers 842 selectively couple busD 887*b* to busE 887*a* and vice versa under the control of the signals CWRrdy and CRDrdy. In non-clamshell mode, busD 887*b* to busE 887*a* are not coupled to each other. In clamshell mode, busD 887*b* may be coupled to busE 887*a* depending upon the value of the MSB of the row address (e.g., R15). The direction that signals are propagated between busD 887*b* and busE 887*a* depends upon whether the operation is a read or a write. Thus, in an embodiment, the signal CWRrdy may be generated, at least in part, according to the following logical equation: CWRrdy=CSm AND R15 AND WRrdy. The signal CRDrdy may be generated, at least in part, according to the following logical equation: CRDrdy=CSm AND R15 AND RDrdy.

Tri-state buffers 843 selectively couple outputs 824*b* of command logic 823*b* to busB 884*b*. When in clamshell mode, the CSm signal tri-states the outputs of buffers 843 so that tri-state buffers 841 may drive busB 884*b*. In an embodiment, the CSm mode signal can also disable channel B DQ interface circuitry 817*b*, channel B CA interface circuitry 816*b*, channel B DQ logic 827*b*, and channel A command logic 823*a*.

Figure 9:
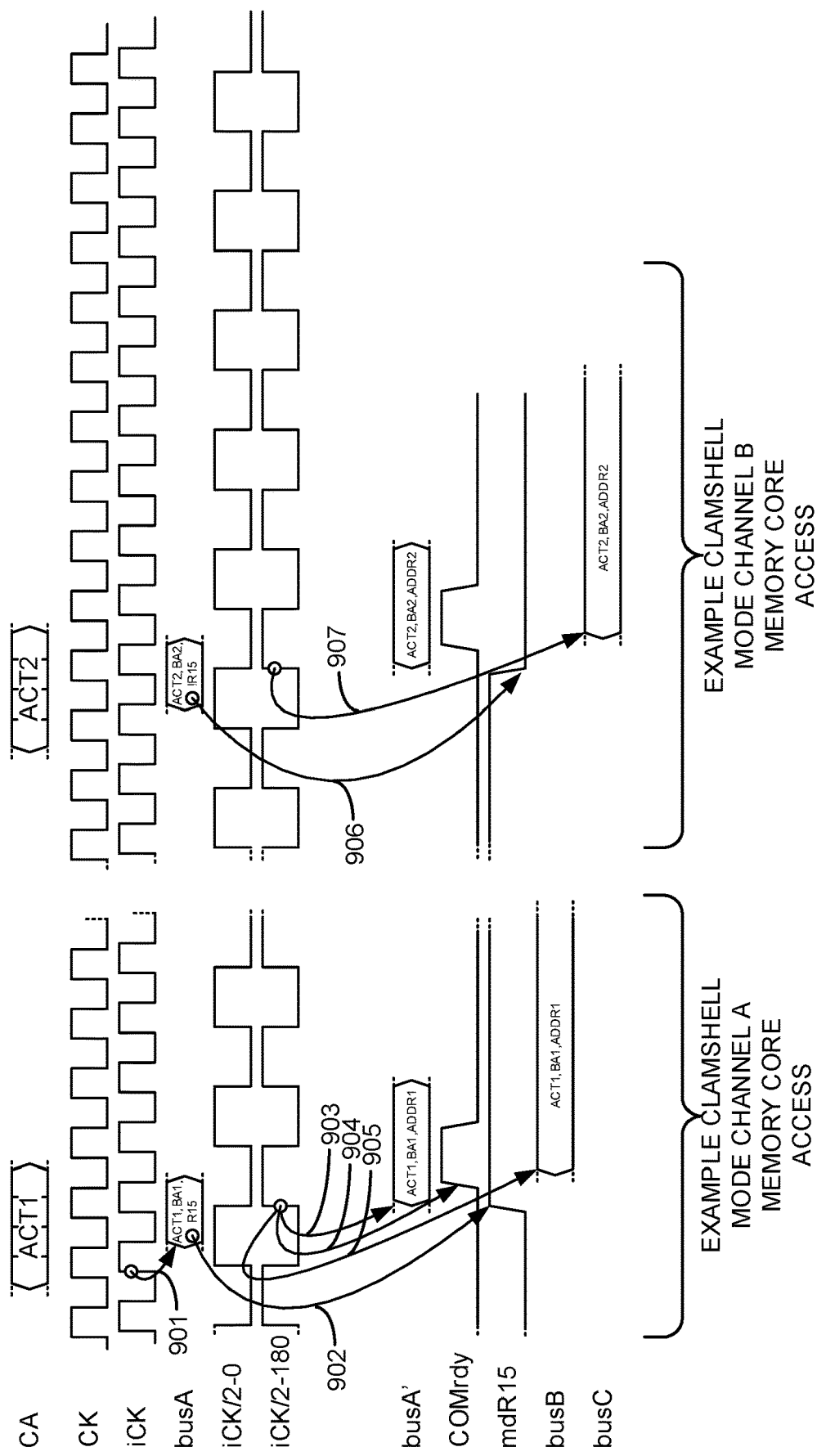
FIG. 9 is a timing diagram illustrating example row accesses for a quad-channel DRAM in clamshell (dual-channel) mode.

FIG. 9 is a timing diagram illustrating example row accesses for a quad-channel DRAM in clamshell (dual-channel) mode. The timings, signals, and functions illustrated in FIG. 9 may be used by one or more of memory device 101, memory system 200, memory system 300, memory system 400, memory system 500, memory system 600, memory device 700, memory device 800, and/or their components.

In FIG. 9, an edge of internal clock, iCK, latches a first activate command (ACT1) on the CA interface and drives (at least) the activate command (ACT1), a first bank address (BA1), and the most significant bit of the row address (R15) onto busA (e.g., busA 825a). This is illustrated in FIG. 9 by arrow 901. The value of R15 and the mode (i.e., clamshell mode) are logically combined to set mdR15 to a logical '1' (e.g., mdR15=CSm AND R15=1.) This is illustrated in FIG. 9 by arrow 902. In other embodiments, different bits may be used to distinguish which memory bank(s) an access is directed to. For example, the most significant bit of the column address, or a bit in the command itself (rather than an address bit) may be used.

An edge of a half-frequency internal clock (e.g., iCK/2-180) times the driving of the activate command, the bank address, and the row address bits (except for the MSB R-15) onto busA' and from busA' to busB. This is illustrated by arrows 903 and 905, respectively. An edge of the half-frequency internal clock also times the assertion of a 'command ready' signal to the memory bank addressed by the bank address (e.g., memory banks 874b-875b.) This is illustrated by arrow 904.

Another edge of internal clock, iCK, latches a second activate command (ACT2) on the CA interface and drives (at least) the second activate command (ACT2), a second bank address (BA1), and the most significant bit of the row address onto busA (e.g., busA 825a). The most significant bit of the row address is the opposite value as for the first activate command. This is illustrated in FIG. 9 using the notation !R15. The value of !R15 and the mode (i.e., clamshell mode) are logically combined to set mdR15 to a logical '0' (e.g., mdR15=CSm AND !R15=0.) This is illustrated in FIG. 9 by arrow 906.

An edge of a half-frequency internal clock (e.g., iCK/2-180) times the driving of the second activate command, the second bank address, and the second row address bits (except for the MSB !R15) onto busA' and from busA' to busC. This is illustrated by arrow 907. An edge of the half-frequency internal clock also times the assertion of a 'command ready' signal to the memory bank addressed by the bank address (e.g., memory banks 874a-875a.)

Figure 10:
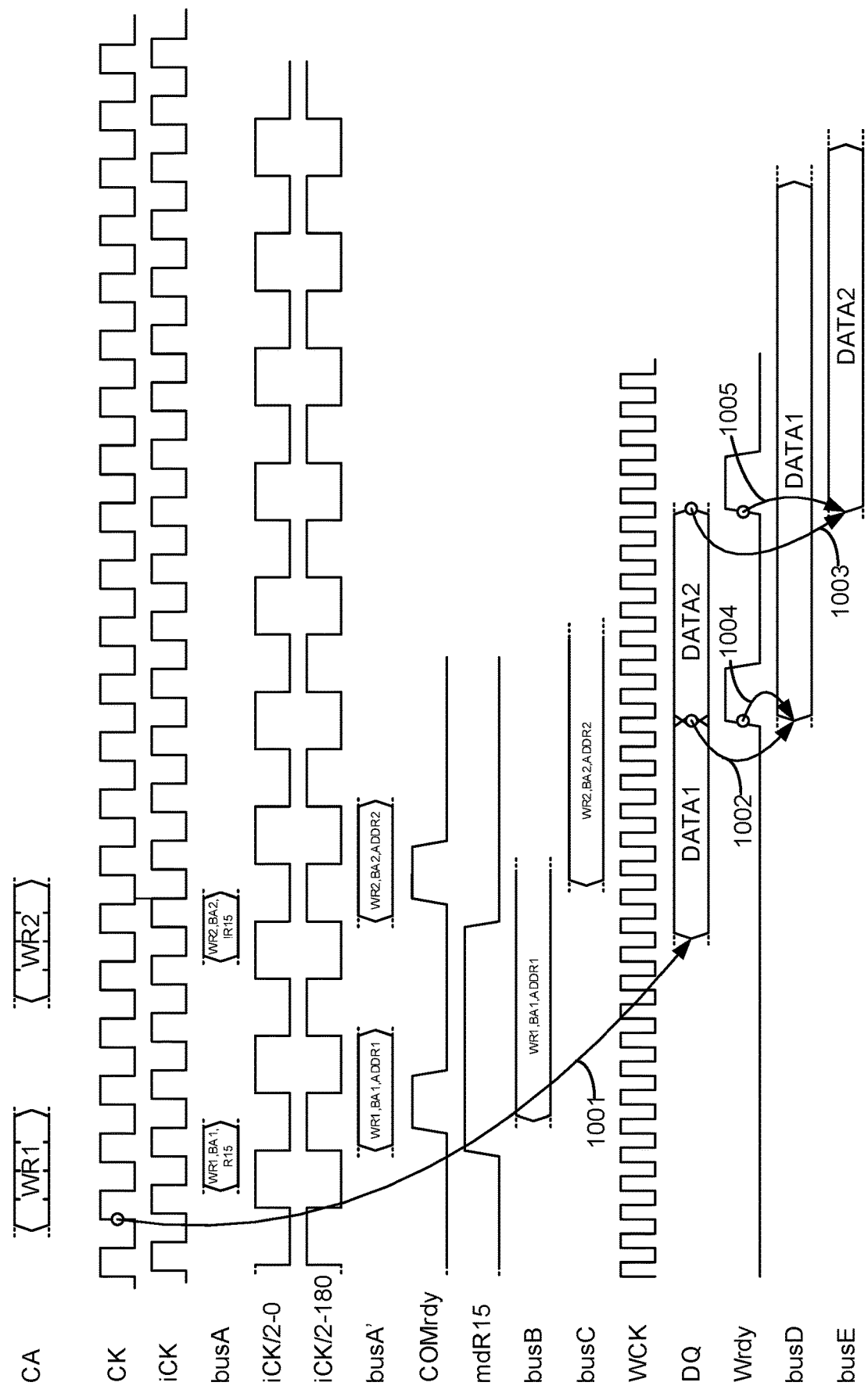
FIG. 10 is a timing diagram illustrating example write accesses for a quad-channel DRAM in clamshell (dual-channel) mode.

FIG. 10 is a timing diagram illustrating example write accesses for a quad-channel DRAM in clamshell (dual-channel) mode. The timings, signals, and functions illustrated in FIG. 10 may be used by one or more of memory device 101, memory system 200, memory system 300, memory system 400, memory system 500, memory system 600, memory device 700, memory device 800, and/or their components.

An edge on the external clock CK initiates the processing of a first write command (WR1). A number of clock CK cycles later, first set of data bits (DATA1) on the external DQ signals is latched into the device by a write clock (WCK) over a number of cycles of WCK. This is illustrated by arrow 1001. This first set of data bits is addressed to a channel B memory bank 874b-875b (note value of mdR15). Thus, the first set of data bits (DATA1) is accompanied by Wrdy and steered to busD. This is illustrated by arrows 1002 and 1004.

Another edge on the external clock CK initiates the processing of a second write command (WR2). A number of clock CK cycles later, second set of data bits (DATA2) on the external DQ signals is latched into the device by a write clock (WCK) over a number of cycles of WCK. This second set of data bits is addressed to a channel A memory bank 874a-875a (note value of mdR15). Thus, the second set of data bits (DATA2) is accompanied by Wrdy and is steered to busE. This is illustrated by arrows 1003 and 1005.

Figure 11:
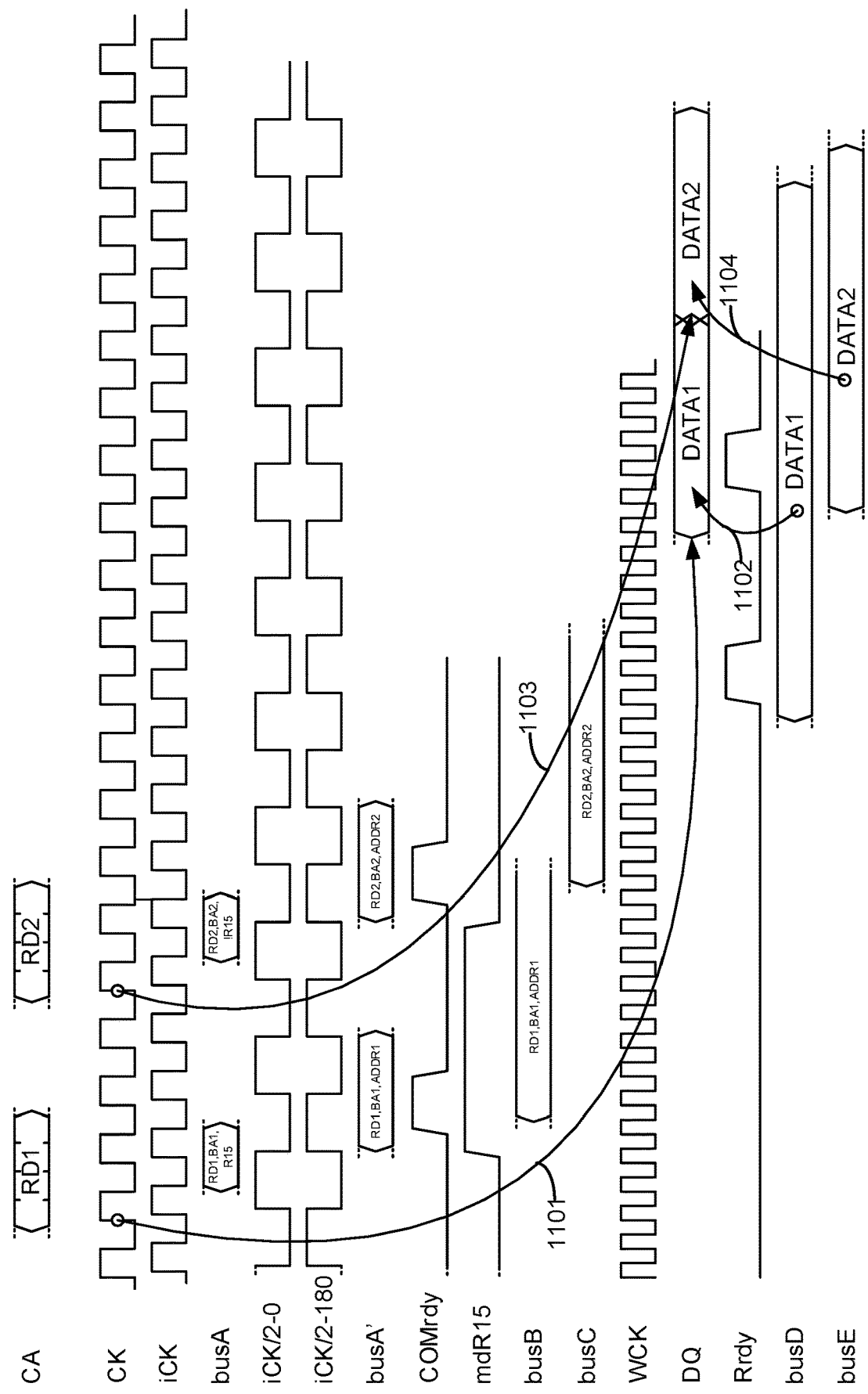
FIG. 11 is a timing diagram illustrating example read accesses for a quad-channel DRAM in clamshell (dual-channel) mode.

FIG. 11 is a timing diagram illustrating example read accesses for a quad-channel DRAM in clamshell (dual-channel) mode. The timings, signals, and functions illustrated in FIG. 11 may be used by one or more of memory device 101, memory system 200, memory system 300, memory system 400, memory system 500, memory system 600, memory device 700, memory device 800, and/or their components.

An edge on the external clock CK initiates the processing of a first read command (RD1). A number of clock CK cycles later, first set of data bits (DATA1) are output on the external DQ signals. This is illustrated by arrow 1101. This first set of data bits comes from a channel B memory bank 874b-875b (note value of mdR15). Thus, the first set of data bits (DATA1) comes from busD and is latched using the Drdy signal. This is illustrated by arrow 1102.

Another edge on the external clock CK initiates the processing of a second read command (RD2). A number of clock CK cycles later, second set of data bits (DATA2) are output on the external DQ signals. This is illustrated by arrow 1103. This second set of data bits comes from a channel A memory bank 874a-875a (note value of mdR15). Thus, the second set of data bits (DATA2) is comes from busE and is latched using the Drdy signal. This is illustrated by arrow 1104.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory device 101, memory system 200, memory system 300, memory system 400, memory system 500, memory system 600, memory device 700, memory device 800, and their components.

These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3-½ inch floppy media, CDs, DVDs, and so on.

Figure 12:
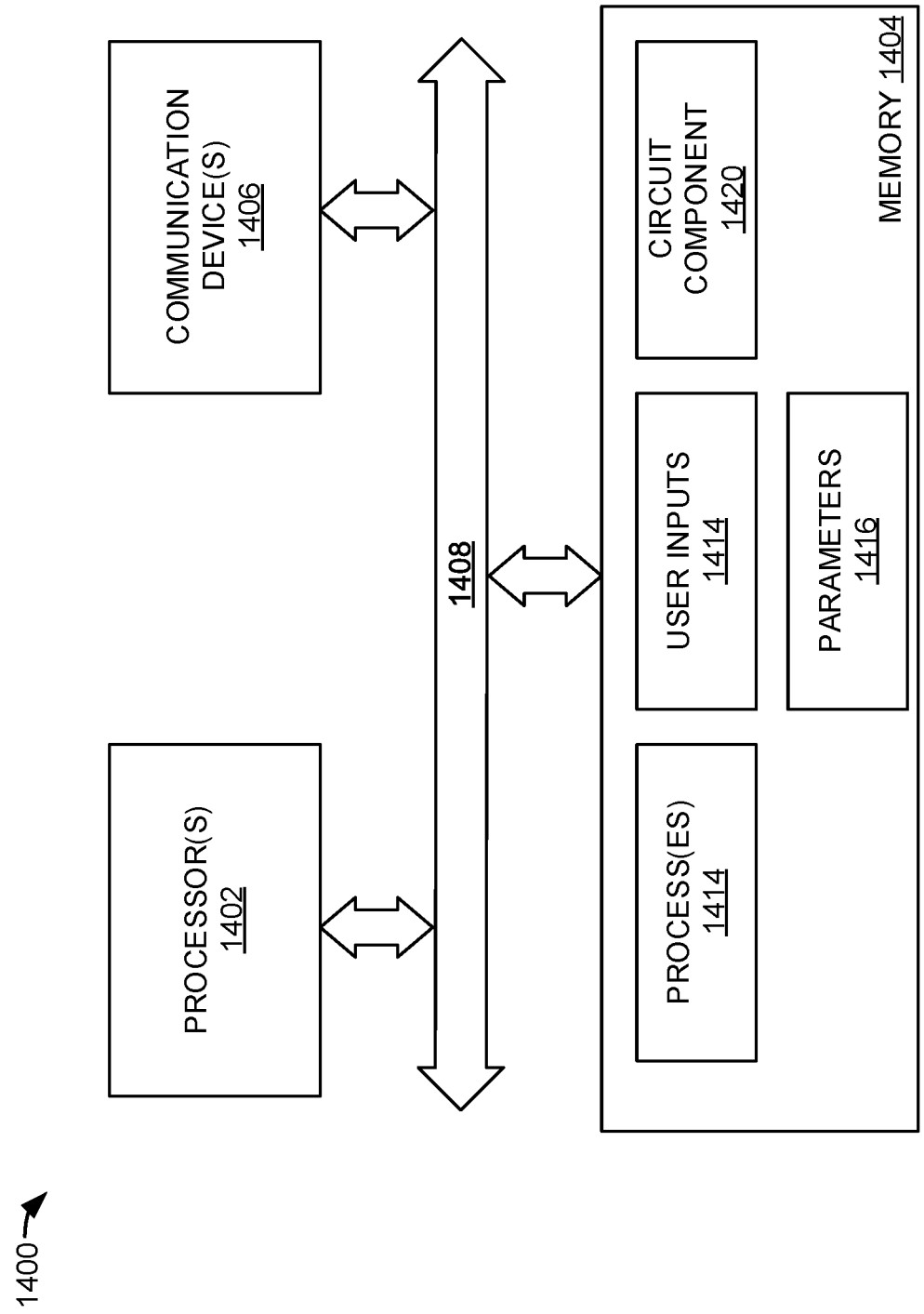
FIG. 12 is a block diagram of a processing system.

FIG. 12 is a block diagram illustrating one embodiment of a processing system 1400 for including, processing, or generating, a representation of a circuit component 1420. Processing system 1400 includes one or more processors 1402, a memory 1404, and one or more communications devices 1406. Processors 1402, memory 1404, and communications devices 1406 communicate using any suitable type, number, and/or configuration of wired and/or wireless connections 1408.

Processors 1402 execute instructions of one or more processes 1412 stored in a memory 1404 to process and/or generate circuit component 1420 responsive to user inputs 1414 and parameters 1416. Processes 1412 may be any suitable electronic design automation (EDA) tool or portion thereof used to design, simulate, analyze, and/or verify electronic circuitry and/or generate photomasks for electronic circuitry. Representation 1420 includes data that describes all or portions of memory device 101, memory system 200, memory system 300, memory system 400, memory system 500, memory system 600, memory device 700, memory device 800, and their components as shown in the Figures.

Representation 1420 may include one or more of behavioral, register transfer, logic component, transistor, and layout geometry-level descriptions. Moreover, representation 1420 may be stored on storage media or communicated by carrier waves.

Data formats in which representation 1420 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1414 may comprise input parameters from a keyboard, mouse, voice recognition interface, microphone and speakers, graphical display, touch screen, or other type of user interface device. This user interface may be distributed among multiple interface devices. Parameters 1416 may include specifications and/or characteristics that are input to help define representation 1420. For example, parameters 1416 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1404 includes any suitable type, number, and/or configuration of non-transitory computer-readable storage media that stores processes 1412, user inputs 1414, parameters 1416, and circuit component 1420.

Communications devices 1406 include any suitable type, number, and/or configuration of wired and/or wireless devices that transmit information from processing system 1400 to another processing or storage system (not shown) and/or receive information from another processing or storage system (not shown). For example, communications devices 1406 may transmit circuit component 1420 to another system. Communications devices 1406 may receive processes 1412, user inputs 1414, parameters 1416, and/or circuit component 1420 and cause processes 1412, user inputs 1414, parameters 1416, and/or circuit component 1420 to be stored in memory 1404.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A dynamic random access memory (DRAM), comprising:
    at least four groups of memory cores;
    at least four memory access channel interfaces that, in a first mode, each respectively are to receive memory access commands, to receive memory access addresses, to receive data to be stored in a corresponding one of the groups of memory cores, and to transmit data retrieved from the corresponding one of the groups of memory cores;
    one-half of the at least four memory access channel interfaces to, in a second mode, each respectively receive memory access commands, receive memory access addresses, receive data to be stored in a corresponding two of the groups of memory cores, and transmit data retrieved from the corresponding two of the groups of memory cores;
    a first one-half of the at least four memory access channel interfaces to have first electrical connection conductors that lie on an opposing sides of a line of reflectional symmetry from second electrical connection conductors of a second one-half of the at least four memory access channel interfaces.

2. The DRAM of claim 1, wherein the at least four memory access channel interfaces consists of four memory access channel interfaces, the first one-half of the at least four memory access channel interfaces consisting of a first memory access channel interface and a second memory access channel interface, the second one-half of the at least four memory access channel interfaces consisting of a third memory access channel interface and a fourth memory access channel interface.

3. The DRAM of claim 2, wherein:
    the third memory channel access interface has third electrical connection conductors, and the fourth memory channel access interface has fourth electrical connection conductors; and,
    the first, second, third, and fourth electrical connection conductors each being disposed in separate physical quadrants.

4. The DRAM of claim 3, wherein the first electrical connection conductors are disposed in a first physical quadrant, the second electrical connection conductors are disposed in a second physical quadrant, the third electrical connection conductors are disposed in a third physical quadrant, and the fourth electrical connection conductors are disposed in a fourth physical quadrant, the first and second physical quadrants being separated from the third and fourth physical quadrants along a first dividing line, the first and third physical quadrants being separated from the second and fourth along a second dividing line, the first and second dividing lines being substantially perpendicular to each other.

5. The DRAM of claim 4, wherein each of the four memory access channel interfaces comprise a set of electrical connection conductors that are each configured to communicate a corresponding set of memory access channel signals, each of the set of memory access channel signals having a respective signal function, each of the set of memory access channel signals in each of the four memory access channel interfaces having a corresponding one of the set of memory access channel signals in each of the other of the four memory access channel interfaces with the same signal function.

6. The DRAM of claim 5, wherein the corresponding signal functions associated with each of the first electrical connection conductors is disposed in reflective symmetry along the second dividing line to the corresponding signal functions associated with each of the second electrical connection conductors.

7. The DRAM of claim 5, wherein the corresponding signal functions associated with each of the first electrical connection conductors is disposed in reflective symmetry along the first dividing line to the corresponding signal functions associated with each of the third electrical connection conductors.

8. The DRAM of claim 5, wherein the corresponding signal functions associated with each of the first electrical connection conductors is disposed in reflective symmetry along the second dividing line to the corresponding signal functions associated with each of the second electrical connection conductors, the corresponding signal functions associated with each of the third electrical connection conductors is disposed in reflective symmetry along the second dividing line to the corresponding signal functions associated with each of the fourth electrical connection conductors, the corresponding signal functions associated with each of the first electrical connection conductors is disposed in reflective symmetry along the first dividing line to the corresponding signal functions associated with each of the third electrical connection conductors, and the corresponding signal functions associated with each of the second electrical connection conductors is disposed in reflective symmetry along the first dividing line to the corresponding signal functions associated with each of the fourth electrical connection conductors.

9. A DRAM device, comprising:
four groups of electrical connection points corresponding to, in a first mode, four memory channel interfaces, the four memory channel interfaces to, in the first mode, operate independently of each other to each access one of four respective sets of memory cores, where the four respective sets of memory cores are non-overlapping sets;
a first two of the four groups of electrical connection points corresponding to, in a second mode, two memory channel interfaces, the two of the four memory channel interfaces to, in the second mode, operate independently of each other to each access one of two respective sets of memory cores, where the two respective sets of memory core are non-overlapping sets, a union of the two respective sets and a union of the four respective sets to result in an equivalent set of memory cores; and,
the first two of the four groups of electrical connection points having, in the second mode, an arrangement of memory channel signal assignments that have reflective symmetry to each other.

10. The DRAM of claim 9, wherein the four groups of electrical connection points as a whole are disposed within a first rectangle and each of the four groups of electrical connection points are each individually disposed within separate, non-overlapping, rectangles that are each within the first rectangle.

11. The DRAM of claim 10, wherein each of the separate, non-overlapping rectangles are disposed within different quadrants of the first rectangle.

12. The DRAM of claim 11, wherein the arrangement of memory channel signal assignments of the first two of the four groups of electrical connection points have, in the second mode, reflective symmetry to each other along a first axis line that divides a first two of the quadrants of the first rectangle from a second two of the quadrants of the first rectangle, the first two quadrants and the second two quadrants being non-overlapping.

13. The DRAM of claim 12, wherein the arrangement of memory channel signal assignments of the first two of the four groups of electrical connection points have, in the second mode, reflective symmetry to each other along a second axis line that divides a third two of the quadrants of the first rectangle from a fourth two of the quadrants of the first rectangle, the third two quadrants and the forth two quadrants being non-overlapping, a first quadrant being a one of the first two quadrants and the third two quadrants, a second quadrant being a one of the second two quadrants and the fourth two quadrants.

14. The DRAM of claim 9, wherein the arrangement of memory channel signal assignments of the first two of the four groups of electrical connection points is the same for the first mode and the second mode.

15. The DRAM of claim 10, wherein, a second two of the four groups of electrical connection points correspond to memory channel interfaces that are activated in the first mode and deactivated in the second mode.

16. A DRAM device, comprising:
a package having a rectangular array of signal connection points, the signal connection points grouped into first, second, third, and fourth quadrants of the rectangular array, each of the first, second, third, and fourth quadrants serving as connection points for a first, a second, a third, and a fourth memory channel, respectively;
at least one DRAM integrated circuit disposed attached to the package, the at least one DRAM integrated circuit to, in a first mode, operate each of the first, second, third, and fourth memory channels independent of each of the other of the first, second, third, and fourth memory channels, the at least one DRAM integrated circuit to, in a second mode, operate the first and third memory channels and disable the second and fourth memory channels.

17. The DRAM device of claim 16, wherein the first quadrant is adjacent to the second quadrant and the fourth quadrant, and the third quadrant is adjacent to the second quadrant that the fourth quadrant.

18. The DRAM device of claim 17, wherein, in the second mode, a first signal arrangement assigned to a majority of the signal connection points of the first memory channel has reflectional symmetry along a first dividing line to a second signal arrangement assigned to the signal connection points of the third memory channel, the first dividing line disposed between the first quadrant and the fourth quadrant and also disposed between the second quadrant and the third quadrant.

19. The DRAM device of claim 17, wherein, in the second mode, a first signal arrangement assigned to a majority of the signal connection points of the first memory channel has reflectional symmetry along a first dividing line to a second signal arrangement assigned to the signal connection points of the third memory channel, the first dividing line disposed between the first quadrant and the second quadrant and also disposed between the third quadrant and the fourth quadrant.

20. The DRAM device of claim 17, wherein, in the second mode, a first signal arrangement assigned to a majority of the signal connection points of the first memory channel has reflectional symmetry along a first dividing line and a second dividing line to a second signal arrangement assigned to the signal connection points of the third memory channel, the first dividing line and the second dividing line collectively defining the first, second, third, and fourth quadrants.

* * * * *